(12) United States Patent
Nakajima

(10) Patent No.: US 7,709,302 B2
(45) Date of Patent: May 4, 2010

(54) METHOD FOR MANUFACTURING A SEMICONDUCTOR DEVICE

(75) Inventor: Setsuo Nakajima, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 137 days.

(21) Appl. No.: 10/752,993

(22) Filed: Jan. 8, 2004

(65) Prior Publication Data

US 2004/0142581 A1    Jul. 22, 2004

Related U.S. Application Data

(62) Division of application No. 10/131,503, filed on Apr. 25, 2002, now Pat. No. 6,706,568.

(30) Foreign Application Priority Data

Apr. 27, 2001    (JP)    ............................. 2001-133518

(51) Int. Cl.
   H01L 21/84    (2006.01)
   H01L 21/336    (2006.01)
   H01L 21/20    (2006.01)
   H01L 21/42    (2006.01)

(52) U.S. Cl. ....................... 438/149; 438/308; 438/486; 438/487; 438/795

(58) Field of Classification Search ................ 438/149, 438/308, 486, 487, 795, 799, 323; 428/323
See application file for complete search history.

(56) References Cited

U.S. PATENT DOCUMENTS 4,879,176 A * 11/1989 Ouderkirk et al. ........... 428/323
5,210,050 A    5/1993 Yamazaki et al.

(Continued)

FOREIGN PATENT DOCUMENTS

EP    0 993 045 A1    4/2000

(Continued)

OTHER PUBLICATIONS

Suga et al. 534-537, 2000 SID 00 DIGEST.

(Continued)

Primary Examiner—Howard Weiss
Assistant Examiner—Steven H Rao
(74) Attorney, Agent, or Firm—Nixon Peabody LLP; Jeffrey L. Costellia

(57) ABSTRACT

A purpose of the invention is to provide a method for leveling a semiconductor layer without increasing the number and the complication of manufacturing processes as well as without deteriorating a crystal characteristic, and a method for leveling a surface of a semiconductor layer to stabilize an interface between the surface of the semiconductor layer and a gate insulating film, in order to achieve a TFT having a good characteristic.

In an atmosphere of one kind or a plural kinds of gas selected from hydrogen or inert gas (nitrogen, argon, helium, neon, krypton and xenon), radiation with a laser beam in the first, second and third conditions is carried out in order, wherein the first condition laser beam is radiated for crystallizing a semiconductor film or improving a crystal characteristic; the second condition laser beam is radiated for eliminating an oxide film; and the third condition laser beam is radiated for leveling a surface of the crystallized semiconductor film.

50 Claims, 13 Drawing Sheets

U.S. PATENT DOCUMENTS

| | | |
|---|---|---|
| 5,212,116 A | 5/1993 | Yu |
| 5,244,819 A | 9/1993 | Yue |
| 5,352,291 A | 10/1994 | Zhang et al. |
| 5,525,550 A | 6/1996 | Kato |
| 5,529,937 A | 6/1996 | Zhang et al. |
| 5,578,520 A | 11/1996 | Zhang et al. |
| 5,604,153 A | 2/1997 | Tsubouchi et al. |
| 5,608,232 A | 3/1997 | Yamazaki et al. |
| 5,621,224 A | 4/1997 | Yamazaki et al. |
| 5,643,826 A | 7/1997 | Ohtani et al. |
| 5,693,541 A | 12/1997 | Yamazaki et al. |
| 5,773,847 A | 6/1998 | Hayakawa |
| 5,776,812 A | 7/1998 | Takahashi et al. |
| 5,786,241 A | 7/1998 | Shimada |
| 5,789,284 A | 8/1998 | Yamazaki et al. |
| 5,795,795 A | 8/1998 | Kousai et al. |
| 5,808,321 A * | 9/1998 | Mitanaga et al. ............... 257/72 |
| 5,828,084 A | 10/1998 | Noguchi et al. |
| 5,843,833 A | 12/1998 | Ohtani et al. |
| 5,861,337 A | 1/1999 | Zhang et al. |
| 5,899,709 A | 5/1999 | Yamazaki et al. |
| 5,907,770 A | 5/1999 | Yamazaki et al. |
| 5,923,962 A | 7/1999 | Ohtani et al. |
| 5,932,893 A | 8/1999 | Miyanaga et al. |
| 5,943,560 A | 8/1999 | Chang et al. |
| 5,956,579 A | 9/1999 | Yamazaki et al. |
| 5,956,581 A | 9/1999 | Yamazaki et al. |
| 5,960,323 A | 9/1999 | Wakita et al. |
| 6,027,960 A | 2/2000 | Kusumoto et al. |
| 6,048,588 A | 4/2000 | Engelsberg |
| 6,048,758 A | 4/2000 | Yamazaki et al. |
| 6,066,516 A | 5/2000 | Miyasaka |
| 6,071,766 A | 6/2000 | Yamazaki et al. |
| 6,071,796 A | 6/2000 | Voutsas |
| 6,072,194 A | 6/2000 | Wakita et al. |
| 6,093,587 A | 7/2000 | Ohtani |
| 6,096,581 A | 8/2000 | Zhang et al. |
| 6,107,639 A | 8/2000 | Yamazaki et al. |
| 6,121,660 A | 9/2000 | Yamazaki et al. |
| 6,124,154 A | 9/2000 | Miyasaka |
| 6,143,661 A | 11/2000 | Kousai et al. |
| 6,160,279 A | 12/2000 | Zhang et al. |
| 6,162,667 A | 12/2000 | Funai et al. |
| 6,165,824 A | 12/2000 | Takano et al. |
| 6,242,291 B1 | 6/2001 | Kusumoto et al. |
| 6,242,292 B1 | 6/2001 | Yamazaki et al. |
| 6,281,057 B2 | 8/2001 | Aya et al. |
| 6,285,042 B1 | 9/2001 | Ohtani et al. |
| 6,300,176 B1 | 10/2001 | Zhang et al. |
| 6,304,329 B1 * | 10/2001 | Nitta et al. .................. 356/459 |
| 6,307,214 B1 | 10/2001 | Ohtani et al. |
| 6,329,269 B1 | 12/2001 | Hamada et al. |
| 6,331,457 B1 | 12/2001 | Yamazaki et al. |
| 6,335,541 B1 | 1/2002 | Ohtani et al. |
| 6,337,229 B1 | 1/2002 | Yamazaki et al. |
| 6,337,259 B1 | 1/2002 | Ueda et al. |
| 6,348,369 B1 | 2/2002 | Kusumoto et al. |
| 6,388,270 B1 | 5/2002 | Yamazaki et al. |
| 6,399,454 B1 | 6/2002 | Yamazaki |
| 6,433,363 B1 | 8/2002 | Yamazaki et al. |
| 6,436,745 B1 | 8/2002 | Gotou et al. |
| 6,444,390 B1 | 9/2002 | Yamazaki et al. |
| 6,444,506 B1 | 9/2002 | Kusumoto et al. |
| 6,444,507 B1 | 9/2002 | Miyasaka |
| 6,444,509 B1 | 9/2002 | Noguchi et al. |
| 6,475,840 B1 | 11/2002 | Miyanaga et al. |
| 6,479,333 B1 | 11/2002 | Takano et al. |
| 6,479,837 B1 | 11/2002 | Ogawa et al. |
| 6,482,684 B1 | 11/2002 | Yamazaki |
| 6,486,437 B2 | 11/2002 | Tanabe |
| 6,489,189 B2 | 12/2002 | Yamazaki et al. |
| 6,517,642 B2 | 2/2003 | Horie et al. |
| 6,528,359 B2 | 3/2003 | Kusumoto et al. |
| 6,534,353 B1 | 3/2003 | Kuramasu et al. |
| 6,559,036 B1 | 5/2003 | Ohtani et al. |
| 6,608,326 B1 | 8/2003 | Shinagawa et al. |
| RE38,266 E | 10/2003 | Yamazaki et al. |
| 6,638,797 B2 | 10/2003 | Noguchi et al. |
| 6,646,287 B1 | 11/2003 | Ono et al. |
| 6,673,126 B2 | 1/2004 | Miyasaka et al. |
| 6,677,222 B1 | 1/2004 | Mishima et al. |
| 6,680,223 B1 | 1/2004 | Yamazaki et al. |
| 6,690,068 B2 | 2/2004 | Yamazaki et al. |
| 6,703,265 B2 | 3/2004 | Asami et al. |
| 6,759,677 B1 | 7/2004 | Yamazaki et al. |
| 6,764,928 B1 | 7/2004 | Ohtani |
| 6,787,807 B2 | 9/2004 | Yamazaki et al. |
| 6,803,296 B2 | 10/2004 | Miyairi |
| 6,821,827 B2 | 11/2004 | Nakamura et al. |
| 6,828,179 B2 | 12/2004 | Yamazaki et al. |
| 6,828,587 B2 | 12/2004 | Yamazaki et al. |
| 6,855,584 B2 | 2/2005 | Yamazaki et al. |
| 6,906,344 B2 | 6/2005 | Yamazaki et al. |
| 6,913,956 B2 | 7/2005 | Hamada et al. |
| 6,924,506 B2 | 8/2005 | Zhang et al. |
| 6,924,528 B2 | 8/2005 | Yamazaki et al. |
| 6,962,837 B2 | 11/2005 | Yamazaki |
| 6,991,976 B2 | 1/2006 | Yamazaki et al. |
| 6,998,639 B2 | 2/2006 | Ohtani et al. |
| 7,015,083 B2 | 3/2006 | Yamazaki et al. |
| 7,087,504 B2 | 8/2006 | Nakajima et al. |
| 7,129,120 B2 | 10/2006 | Yamazaki |
| 7,153,729 B1 | 12/2006 | Yamazaki et al. |
| 7,186,600 B2 | 3/2007 | Ohtani et al. |
| 7,271,042 B2 | 9/2007 | Kusumoto et al. |
| 2001/0003659 A1 | 6/2001 | Aya et al. |
| 2001/0034088 A1 | 10/2001 | Nakamura et al. |
| 2002/0008286 A1 | 1/2002 | Yamazaki et al. |
| 2002/0014625 A1 | 2/2002 | Asami et al. |
| 2002/0038889 A1 | 4/2002 | Yamazaki et al. |
| 2002/0043660 A1 | 4/2002 | Yamazaki et al. |
| 2002/0043662 A1 | 4/2002 | Yamazaki et al. |
| 2003/0071307 A1 | 4/2003 | Noguchi et al. |
| 2003/0139066 A1 | 7/2003 | Kusumoto et al. |
| 2003/0148565 A1 | 8/2003 | Yamanaka |
| 2003/0160239 A1 | 8/2003 | Shinagawa et al. |
| 2003/0207503 A1 | 11/2003 | Yamazaki et al. |
| 2005/0019997 A1 | 1/2005 | Kusumoto et al. |
| 2005/0054181 A1 | 3/2005 | Nakamura et al. |
| 2005/0112850 A1 | 5/2005 | Yamazaki et al. |
| 2006/0131583 A1 | 6/2006 | Ohtani et al. |
| 2006/0148218 A1 | 7/2006 | Yamazaki et al. |
| 2006/0183276 A1 | 8/2006 | Yamazaki et al. |
| 2007/0059949 A1 | 3/2007 | Yamazaki et al. |
| 2007/0105288 A1 | 5/2007 | Miyairi et al. |
| 2007/0117293 A1 | 5/2007 | Ohtani et al. |
| 2007/0196960 A1 | 8/2007 | Kasahara et al. |
| 2008/0138963 A1 | 6/2008 | Yamazaki et al. |

FOREIGN PATENT DOCUMENTS

| | | |
|---|---|---|
| JP | 07-130652 | 5/1995 |
| JP | 07-183540 | 7/1995 |
| JP | 07-235498 | 9/1995 |
| JP | 08-008179 | 1/1996 |
| JP | 08-255916 A | 10/1996 |
| JP | 09-102467 | 4/1997 |
| JP | 09-205213 A | 8/1997 |
| JP | 09-260681 | 10/1997 |
| JP | 10-106951 A | 4/1998 |
| JP | 10-341024 | 12/1998 |
| JP | 11-031660 A | 2/1999 |
| JP | 2000-081642 | 3/2000 |
| JP | 2000-340503 | 12/2000 |

| | | |
|---|---|---|
| JP | 2001-060551 | 3/2001 |
| JP | 2002-093738 | 3/2002 |
| JP | 2003-068642 | 3/2003 |
| JP | 2005-327865 | 11/2005 |

OTHER PUBLICATIONS

Specifications and Drawings for U.S. Appl. No. 10/107,592.

William Feller, "An Introduction to Probability Theory and Its Applications", Third Edition, Jan. 1, 1968, pp. 243-245, vol. 1.

S. M. Sze, " Physics of Semiconductor Devices", Second Edition, Jan. 1, 1968, pp. 386.

S. Bozzo et al, "Chemical Vapor Deposition of Silicon-Germanium Heterostructures", Journal of Crystal Growth, 2000, pp. 171-184, vol. 216.

S. M. Sze, "Physics of Semiconductor Devices". Second Edition, Jan. 1, 1981, pp. 386.

* cited by examiner

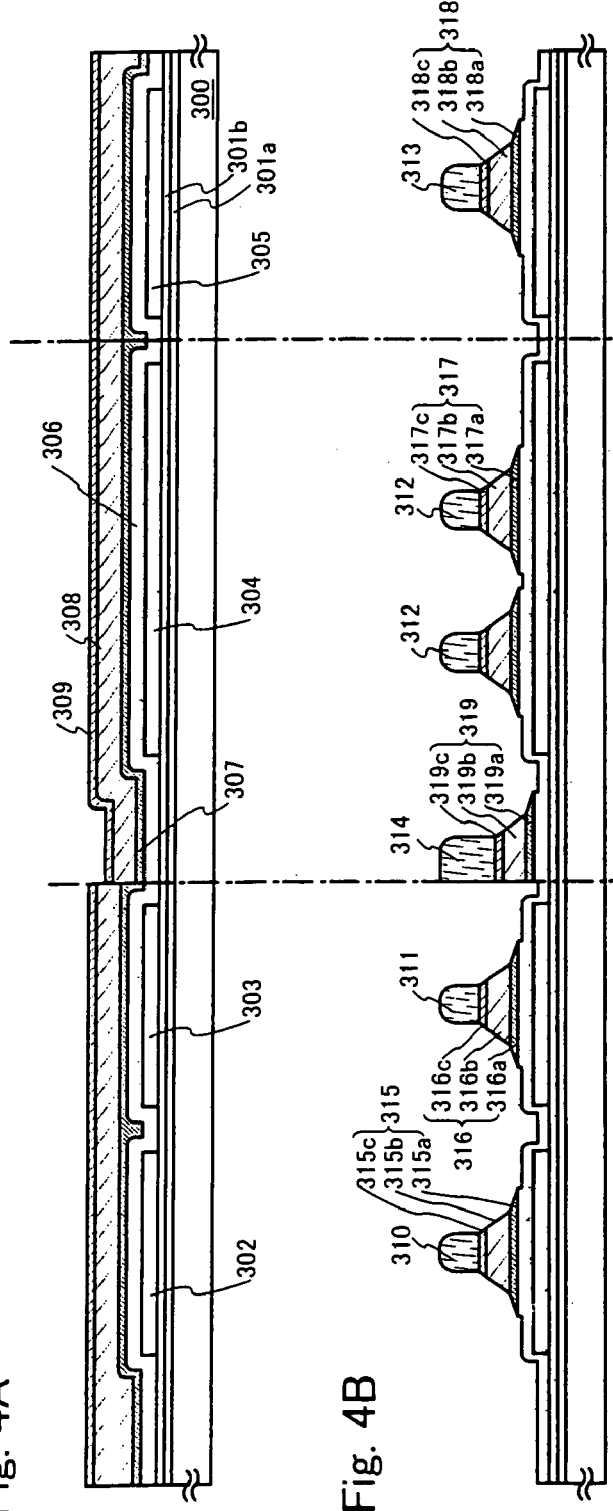
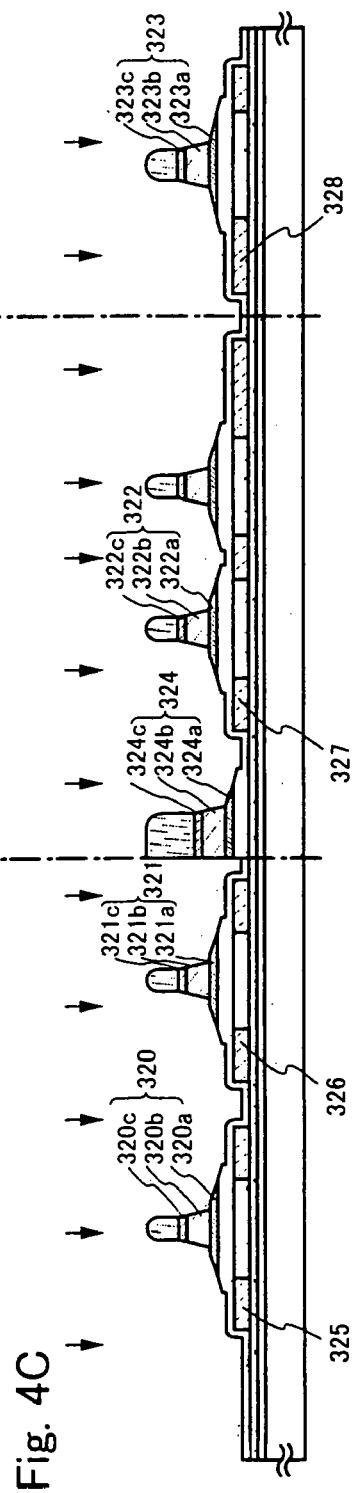
Fig. 4A
Fig. 4B
Fig. 4C

METHOD FOR MANUFACTURING A SEMICONDUCTOR DEVICE

BACKGROUND OF THE INVENTION

1. Field of the Invention

The present invention relates to a method for manufacturing a thin film transistor (TFT) formed by using a crystallized semiconductor for a semiconductor layer including a channel forming region, a source region and a source region, particularly, a method for manufacturing a semiconductor having a good crystal characteristic by laser beam radiation.

2. Description of the Related Art

An active matrix type of liquid crystal display device capable of highly fine display has been manufactured so popularly. In the active matrix type of liquid crystal display device, a TFT is provided in each pixel in a pixel portion as a switching element for driving a liquid crystal. The TFT provided in the pixel portion is switched between on and off to change an orientation of the liquid crystal in order to carry out display.

Especially in a crystallized semiconductor film having high electric field effect mobility (typically, a poly-silicon film) of all others, a carrier moves so fast that, when such crystallized semiconductor film is used for a semiconductor layer including the channel forming region, a source region and a source region, it is possible to provide on a substrate same as the pixel portion a drive circuit capable of corresponding to writing of image data even having high resolution, the drive circuit being required to operate at high speed. Such crystallized semiconductor is on the way to practical use.

Demand of a market, however, does nothing but increase for further fineness, higher brightness and lower cost of a liquid crystal display device. In order to solve a cost problem, it is necessary to develop a technology in which a changeover from a quartz plate, which is expensive per substrate, and thereby, raises a price of a liquid crystal display device as a final product, to a cheap plate (a glass plate, for example) and a changeover from a high temperature process, which needs a manufacturing cost such as electric power, to a low temperature process are possible.

Therefore, a laser beam radiation method or a crystallization method using a catalyst element is used as a method for providing a good element at a cheap price and obtaining a good semiconductor film.

Radiation of a semiconductor film with a laser beam enables the semiconductor film to be crystallized or improved in the crystal character. It is because the semiconductor film is fused due to energy of a laser beam and forms innumerable nucleuses so that respective nucleuses would grow mainly in a direction parallel to a film surface of the semiconductor film to form a crystal particle and be solidified.

In growth of such crystal particle after the laser beam radiation, formed on a semiconductor film a convex portion having the height almost equal to the thickness of the semiconductor film due to a collision between adjacent crystal particles.

In the case that a TFT is manufactured by using semiconductor film, which is obtained in the laser beam radiation process under such condition that a convex portion is formed on a surface thereof and on which the formed convex portion remains, as a semiconductor layer including a channel forming region, a source region and a source region, the roughness of the surface of the semiconductor film is reflected in a gate insulating film and a gate electrode, which are later formed on the semiconductor layer, so that it would cause a problem of dispersion of an element characteristic.

Further, there are problems that leakage easily occurs in an OFF operation of a TFT (a drain current flowing in the OFF operation of a TFT becomes high) and that electrostatic focusing occurs to raise an OFF current, since the film thickness of a semiconductor layer is thick at the convex portion. In addition to the above, the roughness of an interface between the semiconductor layer and the gate insulating film traps a carrier (electron) flowing through the channel forming region so that the carrier would become a fixed electric charge to vary a threshold voltage, which causes decline in reliability.

On the other hand, a semiconductor film having high electric field effect mobility can be obtained in the laser beam radiation process under such condition that a convex portion is formed as described above. There is, accordingly, an antinomy relation.

SUMMARY OF THE INVENTION

A purpose of the invention is, in order to practically manufacture a TFT having a good characteristic, to put into practice a method for leveling the surface of a semiconductor layer without increasing the number and the complication of manufacturing processes as well as without deteriorating the crystal characteristic, and a method for leveling a surface of a semiconductor layer to stabilize an interface between the surface and a gate insulating film.

Another purpose of the invention is to put into practice a method for manufacturing a semiconductor device represented by a liquid crystal display device in which a TFT comprising such semiconductor layer is used for a circuit and/or a switching element.

Thus, the invention is a method for manufacturing a semiconductor device comprising steps of:

forming a semiconductor film over an insulating surface;

forming an oxide film on a surface of the semiconductor film; and radiating the semiconductor film with a laser beam in a first condition, a second condition and a third condition in order in an atmosphere of one kind of gas or a mixed atmosphere of plural kinds of gas, the gas being selected from hydrogen and inert gas, wherein the laser beam in the first condition is a laser beam having a first energy density, a first wavelength, and a first pulse width, wherein the laser beam in the second condition is a laser beam having an energy density, a wavelength and a pulse width respectively lower than those of the laser beam in the first condition, and wherein the laser beam in the third condition is under a condition that the energy density is higher than that of the first condition by 30 to 60 mJ/cm$^2$.

The invention is also a method for manufacturing a semiconductor device including steps of:

forming a semiconductor film over an insulating surface;

forming an oxide film on a surface of the semiconductor film; and radiating the semiconductor film with a laser beam in a first condition, a second condition and a third condition in order in an atmosphere of one kind of gas or a mixed atmosphere of plural kinds of gas, the gas being selected from hydrogen and inert gas, wherein the laser beam in the first condition has a first energy density, a first wavelength and a first pulse width, and radiation of the laser beam in the first condition forms a crystallized semiconductor film to crystallize the semiconductor film, wherein the laser beam in the second condition has an energy density, a wavelength and a pulse width lower than those of the laser beam in the first condition, and radiation of the laser beam in the second condition eliminates the oxide film; and wherein the laser beam in the third condition is a laser beam whose energy density is higher than that of the first condition by 30 to 60 mJ/cm$^2$, and radiation of the laser beam in the third condition levels a surface of the crystallized semiconductor film.

Further, the invention is a method for manufacturing a semiconductor device including steps of:

forming a semiconductor film over an insulating surface;

forming an oxide film on a surface of the above semiconductor film; and radiating the semiconductor film with a laser beam in a first condition, a second condition and a third condition in order in an atmosphere of one kind of gas or a mixed atmosphere of plural kinds of gas, the gas being selected from hydrogen and inert gas, wherein the laser beam in the first condition has a first energy density, a first wavelength and a first pulse width, and radiation of the laser beam in the first condition forms a crystallized semiconductor film to crystallize the semiconductor film, wherein the laser beam in the second condition has an energy density, a wavelength and a pulse width lower than those of the laser beam in the first condition, and radiation of the above laser beam in the second condition eliminates the oxide film, and wherein the laser beam in the third condition is a laser beam whose energy density is higher than that of the first condition by 30 to 60 mJ/cm$^2$, and radiation of the laser beam in the third condition makes a difference between top and bottom points of a surface of the crystallized semiconductor film 6 nm or less.

The invention is further a method for manufacturing a semiconductor device including steps of:

forming a semiconductor film over an insulating surface;

forming a crystallized semiconductor film to crystallize the semiconductor film;

forming an oxide film on a surface of the crystallized semiconductor film; and radiating the crystallized semiconductor film with a laser beam in a first condition, a second condition and a third condition in order in an atmosphere of one kind of gas or a mixed atmosphere of plural kinds of gas, the gas being selected from hydrogen and inert gas, wherein the laser beam in the first condition has a first energy density, a first wavelength and a first pulse width, and radiation of the laser beam in the first condition crystallizes the semiconductor film to form the crystallized semiconductor film, wherein the laser beam in the second condition has an energy density, a wavelength and a pulse width lower than those of the laser beam in the first condition, and radiation of the laser beam in the second condition eliminates the oxide film, and wherein the laser beam in the third condition is a laser beam whose energy density is higher than that of the first condition by 30 to 60 mJ/cm$^2$, and radiation of the laser beam in the third condition levels a surface of the crystallized semiconductor film.

In the invention, the oxide film is formed by contacting the surface of the semiconductor film with a solution or gas containing ozone.

The invention is also a method for manufacturing a semiconductor device including steps of:

forming a semiconductor film over an insulating surface;

adding a catalyst element to the semiconductor film so as to form a crystallized semiconductor film by heat treatment;

forming an oxide film on a surface of the crystallized semiconductor film;

radiating the crystallized semiconductor film with a laser beam; and carrying out a heating process in order to transport the catalyst element included in the crystallized semiconductor film to a gettering site, wherein the step of radiating the crystallized semiconductor film with a laser beam, radiation with a laser beam in a first condition, a second condition and a third condition is carried out in order in an atmosphere of one kind of gas or a mixed atmosphere of plural kinds of gas, the gas being selected from hydrogen and inert gas, wherein the laser beam in the first condition has a first energy density, a first wavelength and a first pulse width, and radiation of the laser beam in the first condition improves a crystal characteristic of the crystallized semiconductor film, wherein the laser beam in the second condition has a energy density, a wavelength and a pulse width lower than those of the laser beam in the first condition, and radiation of the laser beam in the second condition eliminates the oxide film, and wherein the laser beam in the third condition is a laser beam whose energy density is higher than that of the first condition by 30 to 60 mJ/cm$^2$, and radiation of the laser beam in the third condition levels a surface of the crystallized semiconductor film.

In the invention, the inert gas is selected from the group consisting of nitrogen, argon, helium, neon, krypton and xenon.

Furthermore, in the invention, the catalyst element is one kind of or plural kinds of element selected from the group consisting of Fe, Ni, Co, Ru, Rh, Pd, Os, Ir, Pt, Cu and Au.

Furthermore, in the invention, the heat treatment is a heating process in which heating wire, lamp light source or heated gas is used as a heat source.

Furthermore, in the invention, the gettering site includes one kind of or plural kinds of element selected from the group consisting of He, Ne, Ar, Kr and Xe.

Furthermore, in the invention, the gettering site includes one kind of or plural kinds of element selected from elements belonging to the 15th group in a periodic table.

Furthermore, in the invention, the energy density in the first condition is 300 to 500 mJ/cm$^2$.

A semiconductor film can be crystallized by radiation with the laser beam in the first condition in an atmosphere of one kind of gas or a mixed atmosphere of plural kinds of gas, the gas being selected from nitrogen, hydrogen or inert gas. The surface of the crystallized semiconductor film obtained by the first condition laser beam radiation has a convex portion.

Following to the above, an area radiated with the laser beam in the first condition is radiated with a laser beam in the second condition in a process room having the same atmosphere. Thus, an oxide layer is formed on a semiconductor film before the first condition laser beam radiation can be eliminated.

Following to the above, an area, which is radiated with the laser beam in the second condition and in which an oxide layer is eliminated, is radiated with a laser beam in the third condition in a process room having the same atmosphere. Thus, the surface of the crystallized semiconductor film can be leveled.

According to the invention, the second condition laser beam radiation is carried out for an area radiated with the first condition laser beam in a process room having a same atmosphere after the first condition laser beam radiation is carried out for crystallizing a semiconductor film or improving the crystal characteristic, and thereby, an oxide film can be eliminated. The surface of the crystallized semiconductor film can be also leveled by, following to the above, the third condition laser beam radiation of an area, which is radiated by the laser beam in the second condition and in which an oxide layer is eliminated, in a process room having a same atmosphere. The laser beam radiation of a semiconductor film in order from the first condition, the second condition and the third condition enables a process from crystallization to leveling to be performed without changing an atmosphere in a process room, which can shorten time for operation.

Moreover, a process substrate is not contaminated since the process from crystallization to leveling can be continuously carried out without exposure to the air.

BRIEF DESCRIPTION OF THE DRAWINGS

FIGS. 4A through 4C illustrate an example of a process for manufacturing an active matrix substrate in accordance with the invention;

DETAILED DESCRIPTION OF THE INVENTION

Embodiment Mode 1

Figure 1:
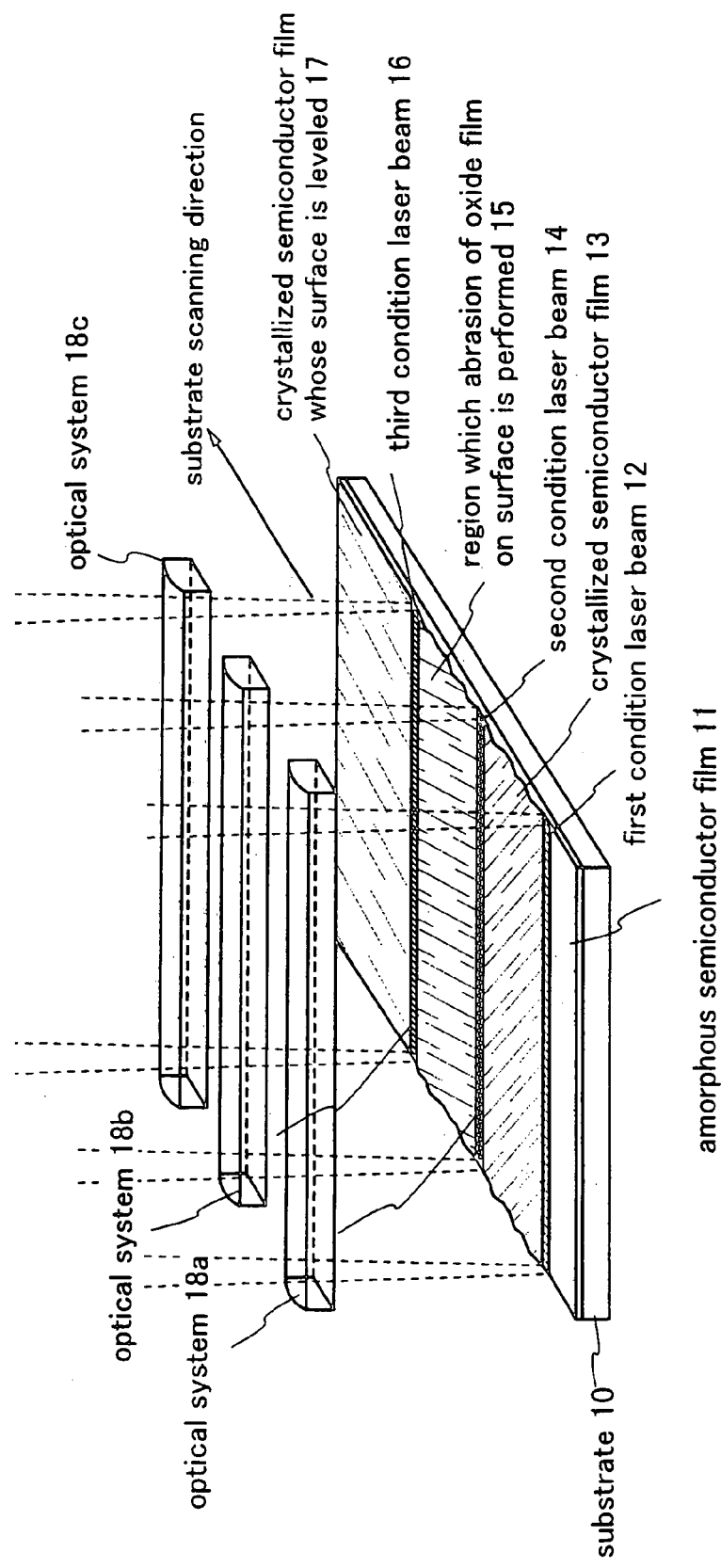
FIG. 1 illustrates an embodiment mode of the invention.

A method according to the invention for forming a crystallized semiconductor film by continuous radiation with a laser beam in three conditions so as to level a convex portion of the surface thereof will be now described with reference to FIG. 1.

First, a ground insulating film (not shown) and an amorphous semiconductor film 11 are formed on a glass substrate 10. Silicon or $Si_{1-x}Ge_x(0<x<1)$ can be used as the semiconductor film. A silicon film is used in this mode for carrying out the invention. Second, the amorphous semiconductor film is washed by means of ozone water as pretreatment for laser annealing to form an oxide film (not shown) on the surface of the amorphous semiconductor film.

Then, in a nitrogen atmosphere, the amorphous semiconductor film is radiated continuously with laser beams in three conditions through optical systems (18a to 18c) provided to satisfy respective conditions. The atmosphere may comprise gas selected from inert gas (argon, helium, neon, krypton or xenon) and hydrogen or mixed gas thereof other than nitrogen.

Radiation with a laser beam in the first condition 12 is first carried out. A gas laser such as an excimer laser and a solid state laser such as an Nd:YAG laser and a YLF laser can be used as the laser beam in the first condition. The energy density is set to be 300 to 500 $mJ/cm^2$ while the pulse width is set to be 20 to 30 ns. The amorphous semiconductor film is crystallized by radiation with such laser beam in the first condition to form a crystallized semiconductor film 13. A convex portion is formed on the surface in crystallizing in the case that the laser beam radiation is carried out when an oxide film exists on the amorphous semiconductor film or when the amorphous semiconductor film is easily oxidized. It is known that a laser beam radiation process in which a convex portion is formed on the surface of the crystallized semiconductor film improves a characteristic of the obtained crystallized semiconductor film. Thus, a convex portion exists on the surface of the crystallized semiconductor film 13 after the process of the first condition laser beam radiation. The oxide film is still left on the crystallized semiconductor film 13.

Radiation with a laser beam in the second condition 14 is then carried out for an area radiated with the laser beam in the first condition. A laser having a shorter wavelength, lower energy density and smaller pulse width than the laser beam in the first condition, such as a laser oscillating a beam having a wavelength in an ultraviolet area or a vacuum ultraviolet area, is used for the laser beam in the second condition. An excimer laser having a short wavelength such as an ArF laser and a KrF laser may be used, for example. A fourth higher harmonic beam of a YAG laser may also be used. Such radiation with the laser beam in the second condition is carried out to perform abrasion of the oxide film on the crystallized semiconductor film obtained by radiation with a laser beam in the first condition in order to expose a crystallized semiconductor film 15. The "abrasion" in this specification means, "a material is radiated with a high intensity of laser beam, so that a surface layer of the material would be abraded due to energy absorbed by the surface or the periphery of the surface".

The area as radiated with the laser beam in the second condition so that the abrasion of the oxide film would have been performed is then radiated with a laser beam in the third condition 16. A gas laser such as an excimer laser and a solid state laser such as an Nd:YAG laser and a YLF laser can be used as the laser beam in the third condition. The energy density is set to be 30 to 60 $mJ/cm^2$ larger than that of the first condition. A crystallized semiconductor film 17 having an leveled surface is accordingly formed by radiation with the laser beam in the third condition under a condition that the oxide film is eliminated from the surface.

A purpose of the radiation with the laser beam in the second condition is to eliminate the oxide film formed on the surface of a semiconductor (silicon) film. Conventionally, in order to eliminate an oxide film formed on a surface of a silicon film, a wet process has been carried out such that a semiconductor film in which an oxide film is formed on the surface thereof is immersed in an inert hydrofluoric acid, for example. According to the invention, however, it is possible to make a crystallized semiconductor film surface level by that a first condition laser beam is irradiated to an area, for the purpose of crystallization of a semiconductor film or improvement of a crystal characteristic, a second condition laser beam is irradiated to the area continuously in a process room of the same atmosphere as irradiation process of the first condition laser beam to perform abrasion of an oxide film, and then, a third condition laser beam is irradiated to the area which abrasion of the oxide film is perfected. Thus, the time for operation can be shortened since it is not necessary to change the atmosphere.

Embodiment Mode 2

In this embodiment mode, an example in which the invention is used for further improving the crystal characteristic after a crystallized semiconductor film is formed by means of an element for accelerating crystallization (referred to as catalyst element, hereinafter) will be described, made with reference to FIGS. 2A through 2F.

A ground insulating film 101 made of a silicon nitride oxide film and an amorphous semiconductor film 102 are formed on a glass substrate 100. The film thickness of the ground insulating film is 200 nm and that of the amorphous semiconductor film is 200 nm. The films 101 and 102 can be formed continuously without exposed to the air. Continuous forming of a film can prevent contamination from occurring. The forming of the ground insulating film can be omitted in the case of using a quartz substrate.

Then, a catalyst element is added to the amorphous semiconductor film 102. In this embodiment mode, nickel is used as a catalyst element and an aqueous solution containing nickel (aqueous solution of nickel acetate) is applied to the film by a spin-coating method to form a catalyst element content layer 103. Iron (Fe), cobalt (Co), ruthenium (Ru), rhodium (Rh), palladium (Pd), osmium (Os), iridium (Ir), platinum (Pt), copper (Cu) and gold (Au) can be used as a catalyst element although nickel is used as the catalyst element in this mode. Sputtering and deposition may be used other than spin-coating in adding a catalyst element.

Next, prior to a crystallizing step, a heating process is carried out for around one hour at 400 to 500° C. to eliminate hydrogen from the film, and then, another heating process is carried out for 4 to 12 hours at 500 to 650° C. to perform a process for crystallizing the semiconductor film so that a crystallized semiconductor film 104 would be formed.

Following to the above, an oxide film 105 is formed on the surface of the crystallized semiconductor film. As a method for forming an oxide film, the surface of the crystallized semiconductor film may be processed by means of an aqueous solution, in which an ozone content aqueous solution, sulfuric acid, hydrochloride acid or nitric acid is mixed with a solution of hydrogen peroxide, or may be formed by generating ozone by radiation with ultraviolet rays under an oxygen atmosphere to oxidize the surface of a semiconductor having the crystal structure. Depositing an oxide film by plasma CVD, sputtering, or vacuum deposition may also form the oxide film.

Figure 2A:
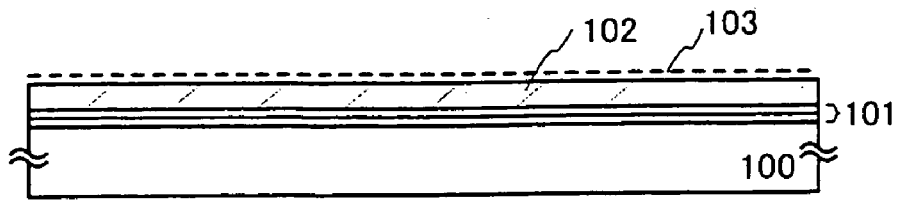
FIGS. 2A through 2F illustrate an example of an embodiment mode of the invention.
Figure 2B:
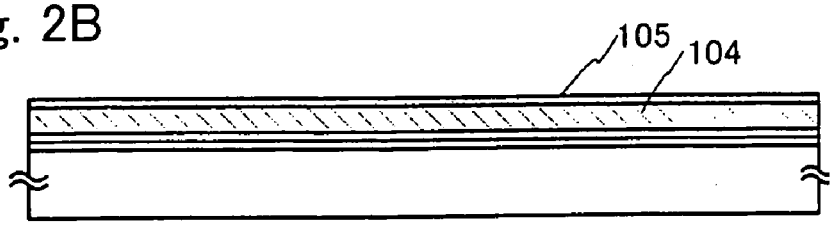
Figure 2C:
Figure 2D:
Figure 2E:
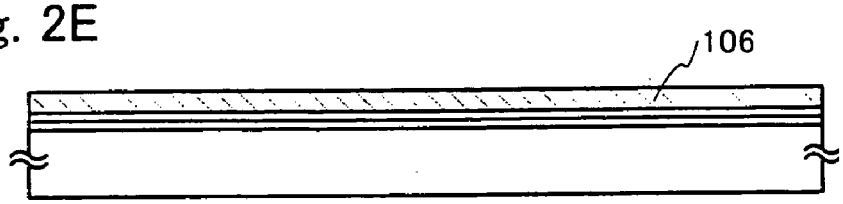
Figure 2F:
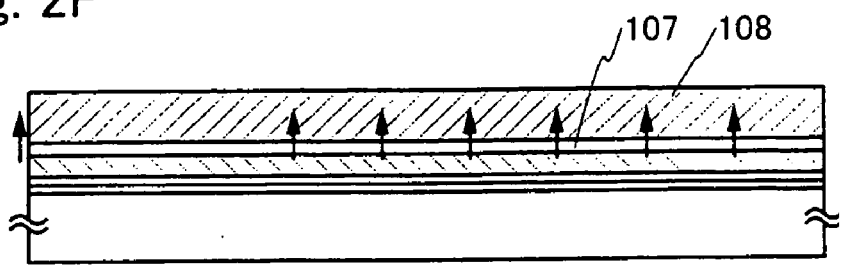

The process of radiation with a laser beam in three conditions is performed here in accordance with the embodiment mode 1 so as to improve the crystal characteristic of a semiconductor film, to eliminate an oxide film 105 and to level the surface of the semiconductor film, and thereby, a crystallized semiconductor film 106 having an leveled surface is formed (FIG. 2C to FIG. 2E).

A step for reducing the concentration of a catalyst element remaining in the crystallized semiconductor film 106 is carried out after the crystallized semiconductor is leveled. It is assumed that the crystallized semiconductor film 106 contains a catalyst element at the concentration of $1\times10^{19}/cm^3$ or more. It is possible to use the crystallized semiconductor film 106 on which the catalyst element remains to manufacture a TFT, but in this case, there is a problem that the catalyst element is segregated in a defect of a semiconductor layer and an OFF current unexpectedly rises. Accordingly, a heating process is carried out for the purpose of eliminating the catalyst element from the crystallized semiconductor film 106 so that the concentration of the catalyst element would be reduced to $1\times10^{17}/cm^3$ or less, preferably $1\times10^{16}/cm^3$ or less.

A process for reducing the concentration of the catalyst element remaining on the crystallized semiconductor film 106 to $1\times10^{17}/cm^3$ or less, preferably $1\times10^{16}/cm^3$ or less is called gettering. In gettering, either an element belonging to the 15th group in a periodic table (represented by phosphorus) or an inert gas element may be used.

A method for transporting the catalyst element to a gettering site to which inert gas is added will be now described.

A barrier layer 107 is formed on the surface of the crystallized semiconductor film 106 after the leveling process is completed. The barrier layer 107 is provided so that the crystallized semiconductor film 106 would not be etched in eliminating by etching a gettering site 108 provided later on the barrier layer 107.

The thickness of the barrier layer 107 is around 1 to 10 nm, and the barrier layer 107 may be easily a chemical oxide formed by processing the crystallized semiconductor film with ozone water. In another example, the chemical oxide can be formed similarly by means of a solution in which sulfuric acid, hydrochloride acid or nitric acid is mixed with a solution of hydrogen peroxide. In another example, the barrier layer may be formed by carrying out a plasma process in an oxide atmosphere or ultraviolet rays radiation in an oxygen content atmosphere so that ozone would be generated to perform an oxidation process. Further, in another example, the barrier layer can be formed by a thin oxide film, which is formed by heating at 200 to 350° C. in a clean oven.

Next, the gettering site 108 is formed on the barrier layer 107 by sputtering. The gettering site 108 is formed by means of a semiconductor film containing inert gas at the concentration of $1\times10^{20}/cm^3$ or more, represented by an amorphous silicon film, which is 25 to 250 nm in thickness. The gettering site 108 has preferably a low density so that a selecting rate of etching to the crystallized semiconductor film 106 would be large since the gettering site 108 is eliminated by etching after the gettering step is completed.

The gettering site 108 is formed by sputtering under a condition that Ar is 50 sccm, film forming power is 3 kW, temperature of a substrate is 150° C. and film forming pressure is 0.2 to 1.0 Pa. In accordance with the above process, the gettering site 108 containing an inert gas element at the concentration of $1\times10^{19}$ to $1\times10^{22}/cm^3$ can be formed. The inert gas element does not badly influence the crystallized semiconductor film 106 since it is inert in a semiconductor film, and therefore, the gettering can be performed.

A heating process for ensuring completion of gettering is carried out following to the above. The heating process may be performed by a method for heating by means of a furnace or an RTA method in which a lamp or heated gas is used as a heat source. In the case of using a furnace, the heating process should be performed in a nitrogen atmosphere at 450 to 600° C. for 0.5 to 12 hours. In the case of the RTA method, a semiconductor film should be heated to around 600 to 1000° C. at a moment.

The catalyst element remaining in the crystallized semiconductor film 106 is transported to the gettering site 108 in such heating process, so that the concentration of the catalyst element in the crystallized semiconductor film 106 can be reduced to $1\times10^{17}/cm^3$ or less, preferably $1\times10^{16}/cm^3$ or less. The gettering site 108 is not crystallized in the heating process for gettering. It may be because the inert gas element is not effused and remains in the gettering site even during the heating process.

The getting site 108 is eliminated by etching after the gettering process is completed. Dry etching by means of $ClF_3$ in which plasma is not used or wet etching in which an alkaline solution such as a solution containing hydrazine or tetraethyl ammonium hydroxide ($(CH_3)_4NOH$) is used can be carried out for the above-mentioned etching. In this etching step, the barrier layer 107 works as an etching stopper for preventing the crystallized semiconductor film 106 from being etched. The barrier 107 can be eliminated by means of hydrofluoric acid after the elimination of the gettering site 108 by etching is completed.

As described above, leveling the crystallized semiconductor film and performing gettering of a catalyst element after the leveling process in accordance with the invention enables the crystallized semiconductor film having a good crystal characteristic and having reduced concentration of the catalyst element to be manufactured with high quality. When a crystallized semiconductor film is leveled according to the invention, the problem that a convex portion is formed on the surface of a semiconductor film due to the laser beam radiation process carried out for improving the crystal characteristic after a crystallization process by means of a catalyst element can be solved, so that the catalyst element segregated in the convex portion can be sufficiently transported to a gettering site.

In the invention, the catalyst element, which is easily segregated in a convex portion of a semiconductor film, can be easily eliminated since the semiconductor film is leveled in the third condition in the laser beam radiation step.

Embodiment Mode 3

In this embodiment mode, described an example in which the invention is applied for further improving the crystal characteristic after a crystallized semiconductor film is formed by a crystallization method using a catalyst element different from the mode 2, made with reference to FIGS. 3A through 3F.

A ground insulating film 201 and an amorphous semiconductor film 202 are formed on a glass substrate 200. The ground insulating film 201 and the amorphous semiconductor film 202 can be formed continuously without exposed to the air. The forming of the ground insulating film 201 can be omitted in the case of using a quartz substrate.

A mask 203 made of insulating film is then formed on the amorphous semiconductor film 202. The mask 203 has 1 µm or more of an opening so that a catalyst element can be added to a selective area of a semiconductor film.

Next, a solution containing a catalyst element, which is 100 ppm in weight conversion, (aqueous solution of nickel acetate containing nickel, in this mode) is applied by a spin-coating method to form a catalyst element contain layer 204. As for a method for adding a catalyst element, deposition and sputtering may be used other than spin-coating.

An element such as iron (Fe), cobalt (Co), ruthenium (Ru), rhodium (Rh), palladium (Pd), osmium (Os), iridium (Ir), platinum (Pt), copper (Cu) and gold (Au) can be used as a catalyst element.

Prior to a crystallizing step, a heating process step is carried out for around one hour at 400 to 500° C. After hydrogen is eliminated from a semiconductor film in this heating process, another heating process is carried out for 6 to 16 hours at 500 to 650° C. to crystallize the semiconductor film in order to form a crystallized semiconductor film 205.

Following to the above, an oxide film 206 is formed on the surface of the crystallized semiconductor film. As a method for forming an oxide film 206, the surface of the crystallized semiconductor film may be processed by means of an aqueous solution, in which an ozone content aqueous solution, sulfuric acid, hydrochloride acid or nitric acid is mixed with a solution of hydrogen peroxide, or may be formed by generating ozone by radiation with ultraviolet rays under an oxygen atmosphere to oxidize the surface of a semiconductor having the crystal structure. Depositing an oxide film by plasma CVD, sputtering, or vacuum deposition may also form the oxide film.

Figure 3A:
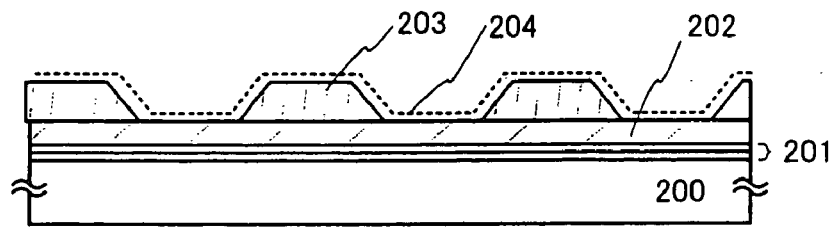
FIGS. 3A through 3F illustrate an example of an embodiment mode of the invention.
Figure 3B:
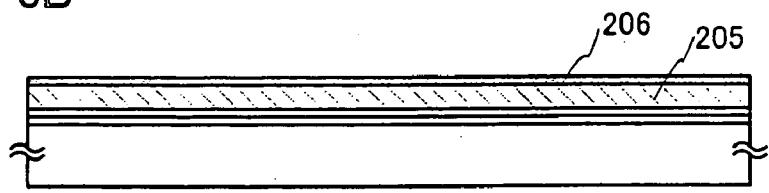
Figure 3C:
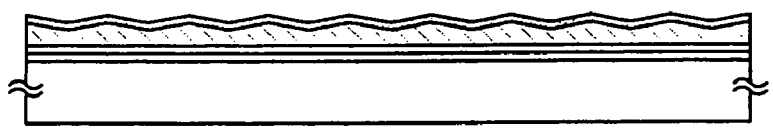
Figure 3D:
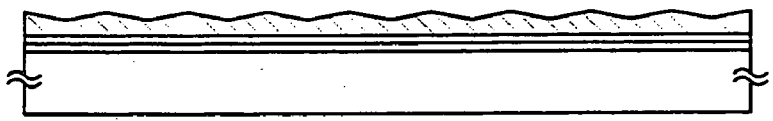
Figure 3E:
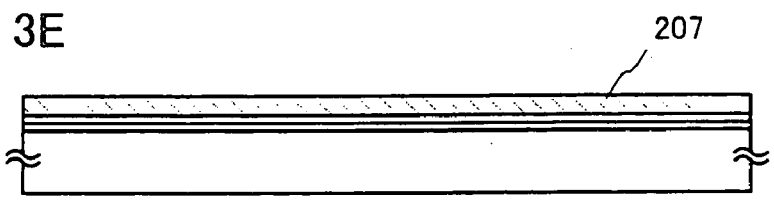
Figure 3F:
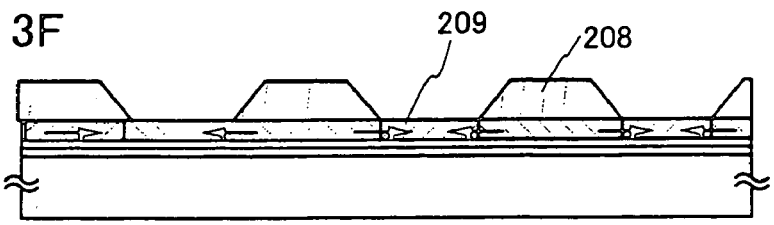

The process of radiation with a laser beam in three conditions is performed here in accordance with the embodiment mode 1 so as to improve the crystal characteristic of a semiconductor film, to eliminate an oxide film 206 and to level the surface of the semiconductor film, and thereby, a crystallized semiconductor film 207 having an leveled surface is formed (FIG. 3C to FIG. 3E).

A heating process for reducing the concentration of a catalyst element remaining in the crystallized semiconductor film 207 (gettering) is carried out after the leveling step is completed. It is possible in gettering to use either a method using an element belonging to the 15th group in a periodic table (represented by phosphorus) or a method in which a catalyst element is transported to a gettering site to which inert gas has been added.

A gettering method using phosphorus will be described in this mode for carrying out the invention.

A mask 208 is formed in order to add phosphorus to an area selected for a gettering site. Phosphorus is then added to the crystallized semiconductor film 207 to form a gettering site 209. Following to this, a heating process is carried out for transporting the catalyst element to the gettering site 209.

The heating process for transporting the catalyst element to the gettering site 209 may be performed by a heat-processing method using a furnace or an RTA method in which a lamp or heated gas is used as a heat source. In the case of using a furnace, the heating process should be performed in a nitrogen atmosphere at 450 to 600° C. for 0.5 to 12 hours. In the case of the RTA method, a semiconductor film should be heated to around 600 to 1000° C. at a moment.

The catalyst element remaining in the crystallized semiconductor film 207 is transported to the gettering site 208 in such heating process, so that the concentration of the catalyst element in the crystallized semiconductor film 207 can be reduced to $1\times10^{17}/cm^3$ or less, preferably $1\times10^{16}/cm^3$ or less.

After the gettering step is completed, the crystallized semiconductor film 207 at a region in which concentration of the catalyst element is reduced to $1\times10^{17}/cm^3$ or less is patterned in a desired shape so that the region is used for a semiconductor layer. The gettering site containing a catalyst element at high concentration can be eliminated in the patterning step for forming a semiconductor layer.

As described above, leveling the crystallized semiconductor film and performing gettering of a catalyst element after the leveling process in accordance with the invention enables the crystallized semiconductor film having a good crystal characteristic and having reduced concentration of the catalyst element to be manufactured with high quality. It is because the catalyst element segregated in the convex portion can be sufficiently transported to a gettering site, when a crystallized semiconductor film is leveled by the laser beam radiation process carried out for improving the crystal characteristic after a crystallization process by means of a catalyst element.

Such use of the invention contributes to sufficiently reduce the concentration of a catalyst element in a crystallized semiconductor film, and thereby, a crystallized semiconductor film having a good characteristic can be obtained. Furthermore, using such semiconductor film to manufacture a TFT results in a TFT having low OFF current and high reliability.

DESCRIPTION OF THE PREFERRED EMBODIMENT

Embodiment 1

An embodiment of the invention will be described with reference to FIGS. 4A to 6. A method for simultaneously manufacturing a pixel portion and a TFT of a drive circuit provided in the periphery of the pixel portion (an N-channel type of TFT and a P-channel type of TFT) on a same substrate will be described here in detail.

A double layer structure is used for a ground insulating film 301 provided on a glass substrate in this embodiment. A single layer film structure of the ground insulating film or a structure in which two or more layers of the ground insulating films are piled can be used, however. A first silicon oxynitride film (component ratio is: Si=32%; O=27%; N=24%; and H=17%), which is formed with $SiH_4$, $NH_3$, and $N_2O$ as reaction gas, is formed as a first layer 301a of the ground insulating film 301 by the plasma CVD method so that the film thickness would be 50 nm. Then, a second silicon oxynitride film (component ratio is: Si=32%; O=59%; N=7%; and H=2%), which is formed with $SiH_4$ and $N_2O$ as reaction gas, is formed as a second layer 301b of the ground insulating film 301 by the plasma CVD method so that the film thickness would be 100 nm.

Next, an amorphous silicon film is formed on the ground insulating film 301 by the plasma CVD method so that the film thickness would be 50 nm, and a nickel acetate basic solution containing 10 ppm of nickel in weight conversion is applied on by mean of a spinner. It is also possible to spread the nickel element all over the surface by sputtering instead of applying.

A semiconductor film is crystallized in a heating process to form a crystallized semiconductor film following to the above. An electric furnace or radiation with an intense beam can be used for the heating process. In the case of using an electric furnace, the heating process is performed at 500 to 650° C. for 4 to 24 hours. In this embodiment, a heating process for crystallization (550° C., 4 hours) is carried out to obtain a crystal silicon film after a heat process for dehydrogenation (500° C., 1 hour). The crystallization may be performed by means of a lamp-annealing device although it is carried out in a heating process using a furnace in this embodiment.

Radiation of a laser beam in three conditions is then performed continuously in a nitrogen atmosphere. The atmosphere may comprise one kind of or plural kinds of gas selected from inert gas (argon, helium, neon, krypton and xenon) and hydrogen other than nitrogen. A purpose of the first condition laser beam radiation is to compensate a defect remained in a crystal particle for improving a crystal characteristic. Any of an excimer laser beam or a second higher harmonic beam, a third higher harmonic beam and a fourth higher harmonic beam of a YAG laser beam may be used as the laser beam. An XeCl laser (308 nm in wavelength) is used for the first condition so that the laser beam would be radiated with the repeated frequency being at 30 Hz, the energy density at 400 $mJ/cm^2$ and the pulse width at 30 ns, in this embodiment.

The second condition laser beam radiation is then performed for the purpose of elimination of an oxide film formed on the surface of a semiconductor film before the first condition laser beam radiation. For the laser beam in the second condition, a laser having a shorter wavelength, lower energy density and smaller pulse width than those of the laser beam in the first condition is used, and preferably, especially a laser having 248 nm or less of wavelength and 5 ns or less of pulse width. An ArF laser (193 nm in wavelength) is used for the second condition so that the laser beam would be radiated with the repeated frequency being at 30 Hz, the energy density at 300 $mJ/cm^2$ and the pulse width at 5 ns, in this embodiment.

The third condition laser beam radiation is then performed for the purpose of leveling of a convex portion on the surface of a semiconductor film formed in the first condition laser beam radiation. Any of an excimer laser beam or a second higher harmonic beam or a third higher harmonic beam of a YAG laser beam may be used as the laser beam. A beam emitted from an ultraviolet rays lamp may be used instead of the excimer beam. The energy density of the laser beam in the third condition is preferably 30 to 60 $mJ/cm^2$ larger than that of the first condition. An XeCl laser (308 nm in wavelength) is used so that the third condition laser beam would be radiated with the repeated frequency being at 30 Hz, the energy density at 430 $mJ/cm^2$ and the pulse width at 30 ns, in this embodiment. A value of P–V of an unleveled portion on the surface of the semiconductor film becomes 6 nm or less after the radiation with the laser beam in the third condition.

The surface of a semiconductor film can be leveled as described above, and thereby, a problem of electric field focusing can be solved. Moreover, the OFF current can be reduced since the film thickness is stable.

Next, a mask comprising a resist is formed after forming a thin oxide film on the surface of an obtained crystal silicon film (also called a poly-silicon film) by means of ozone water so as to form semiconductor layers 302 to 305, which are separated after being etched into a desired shape in an etching process. The mask comprising a resist is eliminated after the semiconductor layers are formed.

It may be also possible to add an impurity element, which gives a P type or an N type, in order to control a threshold of a TFT (Vth) after forming the semiconductor layers 302 to 305. Elements belonging to the 13th group in the periodic table such as boron (B), aluminum (Al) and gallium (Ga) are known as the impurity element giving a P type to a semiconductor, while elements belonging to the 15th group in the periodic table, typically phosphorus (P) and arsenic (As), are known as the impurity element giving an N type to a semiconductor.

The oxide film is then eliminated by means of etchant containing hydrofluoric acid simultaneously with washing of the surface of the silicon film to form an insulating film, which would be a gate insulating film 306 and whose basis is silicon. In this embodiment, the insulating film is formed from a silicon oxide nitride film (component ratio is: Si=32%; O=59%; N=7%; and H=2%) by the plasma CVD method so as to be 115 nm in thickness.

The surface of a semiconductor layer is leveled through the process from crystallization (or improvement of a crystal characteristic) to leveling according to the invention, in which radiation with the laser beam in three conditions is performed in order.

Thus, an interface between the semiconductor layer and the gate insulating film is stable and good, which leads to improvement of reliability of a TFT.

Next, a first conductive film 307 having 20 to 100 nm of film thickness, a second conductive film 308 having 100 to 400 nm of film thickness and a third conductive film 309 having 20 to 100 nm of film thickness are piled on a gate insulating film 306, as shown in FIG. 4A. In this embodiment, a tungsten film having 50 nm of thickness, an alloy film of aluminum and titanium (Al—Ti), which has 500 nm of film thickness, and a titanium film having 30 nm of film thickness on the gate insulating film 306 are piled in order.

Conductive materials forming the first to third conductive films are made of an element selected from Ta, W, Ti, Mo, Al and Cu, or an alloy material or a chemical compound material using the element as main. A semiconductor film represented by a polycrystalline silicon film, which is formed by doping an impurity element such as phosphorus, may be used for the first to third conductive films. For example, tungsten nitride may be used instead of tungsten for the first conductive film, an alloy film of aluminum and silicon (Al—Si) may be used for the second conductive film instead of the alloy film of aluminum and titanium (Al—Ti), and a film of titanium nitride may be used for the third conductive film instead of the titanium film. Further, the structure is not limited to a triple layer and it may be double layer comprising a tantalum nitride film and a tungsten film, for example.

Masks 310 to 314 comprising a resist are formed in an optical exposure step as shown in FIG. 4B, to carry out a first etching process for forming a gate electrode and a wiring. The first etching process is carried out under first and second etching conditions. An ICP (inductively coupled plasma) etching method can be used for etching. The etching condition (electric energy applied to a coil type of electrode, electric energy applied to an electrode on the substrate side, temperature of an electrode on the substrate side, etc.) is properly controlled by the ICP etching method so that the film can be etched into a desired shape of taper. It is possible to use, as etching gas, chlorine gas represented by $Cl_2$, $BCl_3$, $SiCl_4$ and $CCl_4$, fluorine gas represented by $CF_4$, $SF_6$ and $NF_3$, or $O_2$ properly.

The etching gas to be used is not limited, but using $BCl_3$, $Cl_2$ and $O_2$ is suitable. Respective gas flow rates are set at 65/10/5 sccm and 450 W of RF (13.56 MHz) power is given with 1.2 Pa of pressure to a coil type of electrode to generate plasma, in order to perform etching for 117 seconds. 300 W of RF (13.56 MHz) power is also given to the substrate side (a sample stage) so that a practically minus self-bias voltage would be applied. An Al film and a Ti film are etched under this first etching condition to form an end of the first conductive layer into a shape of taper.

The etching condition is changed to the second one after the above, in which $CF_4$, $Cl_2$ and $O_2$ are used for the etching gas, respective gas flow rates are set at 25/25/10 sccm, and 500 W of RF (13.56 MHz) power is given with 1 Pa of pressure to a coil type of electrode to generate plasma, in order to perform etching for around 30 seconds. 20 W of RF (13.56 MHz) power is also given to the substrate side (a sample stage) so that a practically minus self-bias voltage would be applied. The Al film, the Ti film and a W film are all etched to the similar degree under the second etching condition in which $CF_4$ and $Cl_2$ are mixed. It is better to increase the etching time at a rate of around 10 to 20% in order to carry out etching without any residue on the gate insulating film.

In this first etching process, a shape of the mask comprising a resist is made suitable so that ends of the first conductive layer, the second conductive layer and the third conductive layer would be in a shape of taper due to an effect of a bias voltage applied to the substrate side. An angle of the taper portion is 15 to 45°. First shape gate electrodes 315 to 319 (first electrodes 315a to 319a, second electrodes 315b to 319b, and third electrodes 315c to 319c) comprising the first, second and third conductive layers are formed in the first etching process, as described above. An area of the gate insulating film, which is not covered with the first shape gate electrodes 315 to 319, is etched by around 20 to 50 nm, and thereby, becomes thin.

A second etching process is then carried out without eliminating the masks 310 to 314 comprising a resist, as shown in FIG. 4C. $BCl_3$ and $Cl_2$ are used for the etching gas, respective gas flow rates are set at 20/60 sccm, and 600 W of RF (13.56 MHz) power is given with 1.2 Pa of pressure to a coil type of electrode to generate plasma, in order to perform etching. 100 W of RF (13.56 MHz) power is given to the substrate side (a sample stage). The second and third electrodes of the first shape gate electrodes are etched under this third etching condition. The aluminum film containing a small amount of titanium and the titanium film are thus anisotropy-etched under the above third etching condition so as to form second shape gate electrodes 320 to 324 (first electrodes 320a to 324a, second electrodes 320b to 324b, and third electrodes 320c to 324c). An area of the gate insulating film, which is not covered with the second shape gate electrodes 320 to 324, is etched a little, and thereby, becomes thin.

Then, a first doping process is carried out without eliminating a mask comprising a resist so as to add an impurity element giving an N type to a semiconductor layer (referred to as an N type of impurity element, hereinafter). The doping process can be performed by the ion-doping method or the ion-implantation method. Phosphorus (P) or arsenic (As) is typically used as the N type of impurity element. In this case, the second shape gate electrodes 320 to 323 work as a mask for the N type of impurity element, and N types of impurity region 325 to 328 having a first concentration are formed in self aligning. The N type of impurity element is added in a concentration range from $1 \times 10^{16}$ to $1 \times 10^{17}/cm^3$ to the N types of impurity region having the first concentration 325 to 328.

The first doping process is carried out without eliminating a mask comprising a resist in this embodiment. It can be performed, however, after eliminating the mask comprising a resist.

Figure 5A:
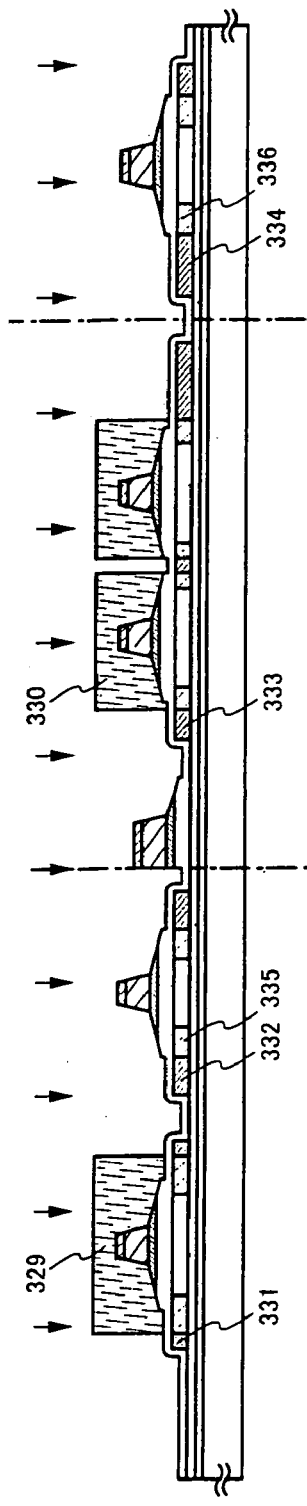
FIGS. 5A through 5C illustrate an example of a process for manufacturing an active matrix substrate in accordance with the invention.

Following to the above, after the mask comprising a resist is eliminated, masks 329 and 330 comprising a resist are formed as shown in FIG. 5A to carry out a second doping process. A mask 329 protects a channel forming region of a semiconductor layer forming one of the P-channel types of TFT in a drive circuit and its peripheral region. The mask 330 protects a channel forming region of a semiconductor layer forming a TFT in a pixel portion and its peripheral region.

In the second doping process, impurity regions are formed on each semiconductor layer, using a difference in the film thickness between the second shape gate electrodes 320 to 324 and the gate insulating film. Phosphorus (P) is not added to an region covered by the masks 329 and 330, of course. Thus, N types of impurity region having the second concentration 335 and 336 and N types of impurity region having the third concentration 331 to 334 are formed. An N type of impurity element is added in a concentration range from $1 \times 10^{20}$ to $1 \times 10^{21}/cm^3$ to the N types of impurity region having the third concentration 331 to 334. The N type of impurity region having the second concentration is formed so as to have a lower concentration than that of the N type of impurity region having the third concentration due to a difference in the film thickness of the gate insulation film, and an N type of impurity element is added in a concentration range from $1\times10^{18}$ to $1\times10^{19}/cm^3$ to the N types of impurity region having the second concentration.

Figure 5B:
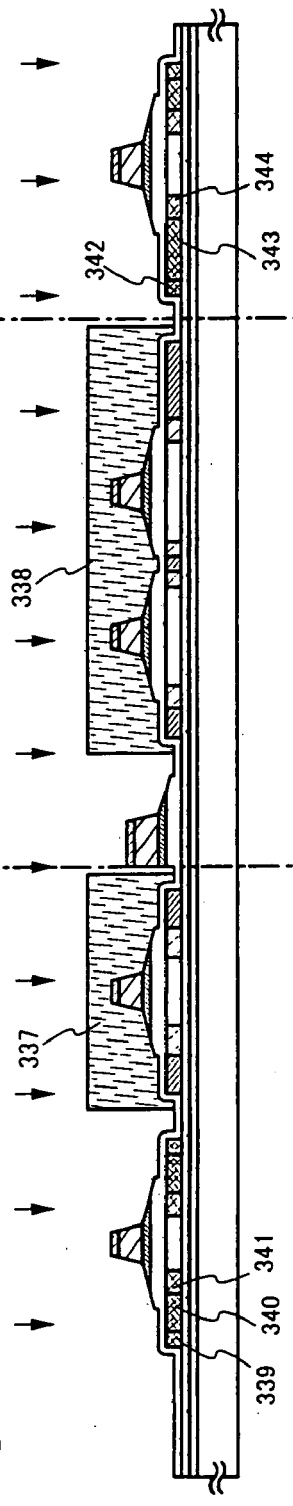

Then, after the masks 329 and 330 comprising a resist are eliminated, masks 337 and 338 comprising a resist are newly formed so as to carry out a third doping process as shown in FIG. 5B. In this third doping process, P type of impurity regions having the first concentration 341 and the second concentration 339 and 340, to which an impurity element giving a P type of conductivity to a semiconductor layer forming a P-channel type of TFT (referred to as a P type of impurity element, hereinafter) is added, are formed. The P type of impurity region having the first concentration is formed at an region overlapped with the second shape gate electrode, and a P type of impurity element is added in a concentration range from $1\times10^{18}$ to $1\times10^{20}/cm^3$ to the P type of impurity region having the first concentration. A P type of impurity element is added in a concentration range from $1\times10^{20}$ to $1\times10^{21}/cm^3$ to the P types of impurity region having the second concentration 339 and 340. The P type of impurity region having the second concentration 339 to which phosphorus (P) is added in the above-mentioned step has the P type of conductivity since the P type of impurity element is added 1.5 to 3 times in concentration as much as the phosphorus.

The P types of impurity region having the second concentration 342 and 343 and the P type of impurity region having the first concentration 344 are formed into a semiconductor layer forming a holding capacity in a pixel portion.

The N type of impurity region or the P type of impurity region is formed in each semiconductor layer in the steps until the above. The second shape gate electrodes 320 to 322 are used as the gate electrodes of respective TFTs. The second shape gate electrode 323 is used as one electrode for forming a holding capacity in a pixel portion. Furthermore, the second shape electrode 324 forms a source wiring in a pixel portion.

Next, a step for activation-processing the impurity element added to each semiconductor layer is carried out. The step for activating the impurity element is performed by one of a rapid thermal annealing method (RTA method) using a lamp light source or heated gas as a heat source, a method in which radiation with a YAG laser or an excimer laser is carried out from the back surface, and a heating process method using a furnace, or by a method combining any of the above. In this embodiment, however, it is important to set a heating process condition so that the second conductive layer can undergo the above heating process condition in the activation step since a material based on aluminum is used for the second conductive layer.

At the same time as the above activation process, nickel used as a catalyst in crystallization is gettered to the N types of impurity region having the third concentration 331 to 333 in which phosphorus is contained at a high concentration and to the P types of impurity region having the second concentration 339 and 342, so that the concentration of nickel in the semiconductor layer, which is mainly used as a channel forming region, would be reduced. As a result, in a TFT having the channel forming region, a value of the OFF current decreases and the crystal characteristic is good, and thereby, high electric field effect mobility can be obtained, so that a good characteristic of the TFT can be achieved. In the case that a first gettering step is carried out just after the leveling process of a semiconductor film as in a method shown in the embodiment modes 2 and 3, the gettering by means of phosphorus is the second step. The second gettering step is not necessary when gettering is sufficiently performed in the first gettering step.

In this embodiment, an example is described such that an insulating film is formed before the activation mentioned above. The insulating film may be formed, however, after completing the above activation.

Figure 5C:
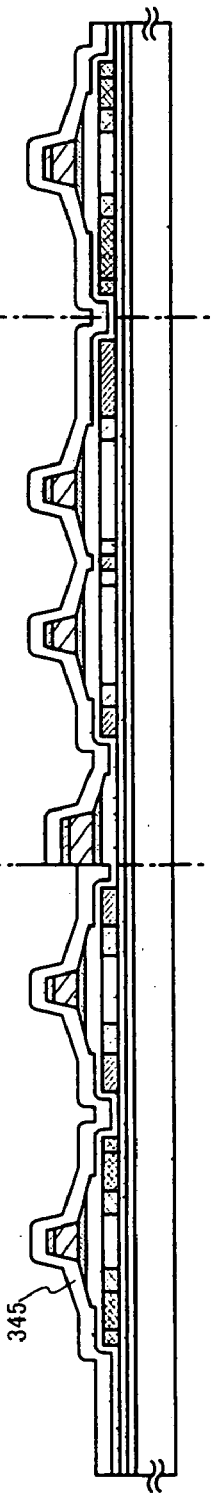
Figure 6:
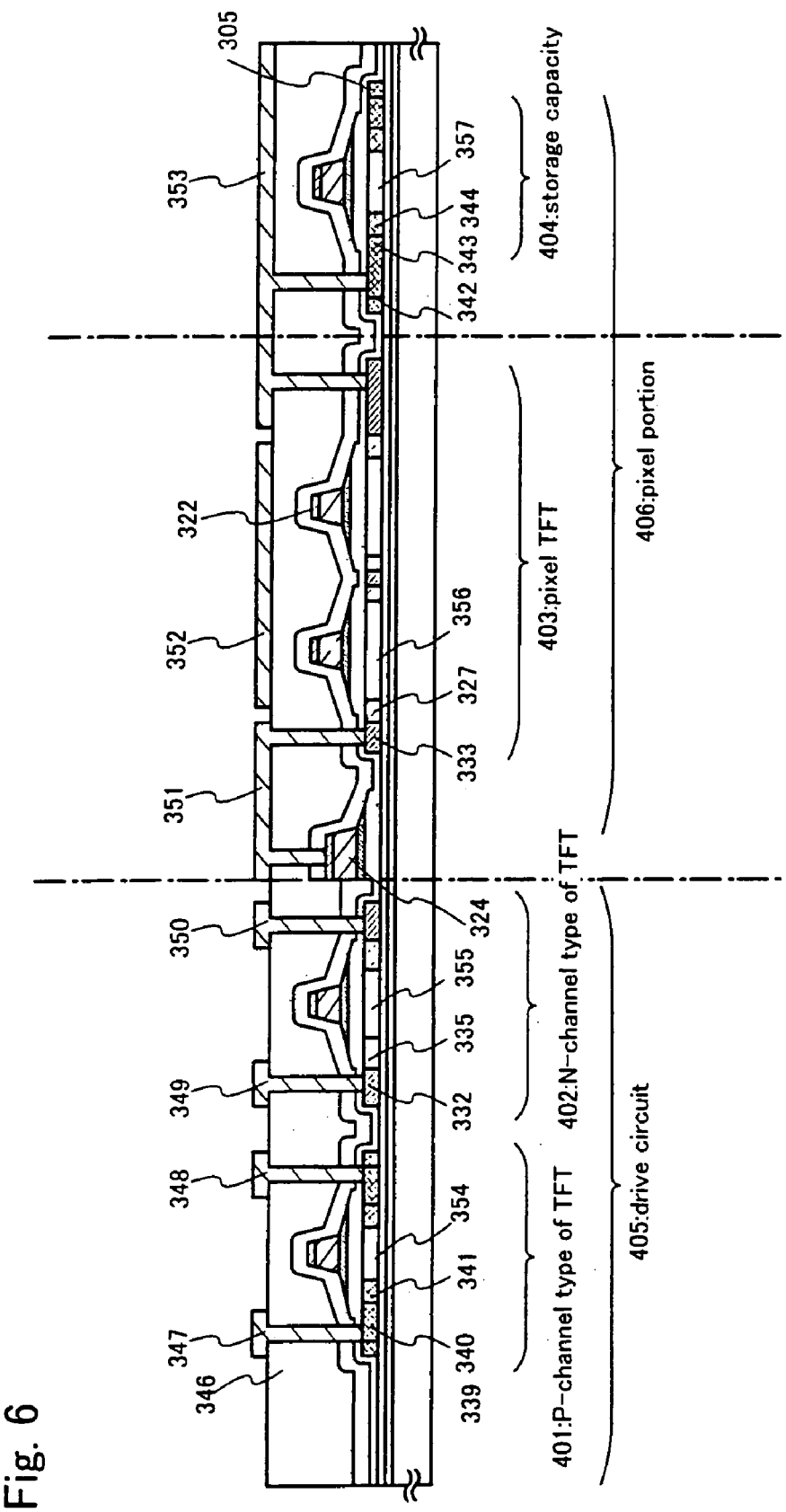
FIG. 6 illustrates an example of a process for manufacturing an active matrix substrate in accordance with the invention.

Next, a first layer insulating film 345 comprising a silicon nitride film is formed and a heating process (a heating process at 300 to 550° C. for 1 to 12 hours) is carried out so as to perform a step for producing a hydride of a semiconductor layer. (FIG. 5C). In this step, dangling bond of a semiconductor layer is terminated by means of hydrogen contained in the first layer insulating film 345. According to this step, a hydride of a semiconductor layer can be produced regardless of existence of an insulating film comprising a silicon oxide film (not shown). In this embodiment, however, it is important to set a heating process condition such that the second conductive layer can undergo the above heating process condition in the step for producing a hydride since a material based on aluminum is used as the second conductive layer. A plasma hydride production method (in which hydrogen excited by plasma is used) may be used as another method for producing a hydride.

Then, a second interlayer insulating film 346 comprising an organic insulating material is formed on the first interlayer insulating film 345. An acrylic resin film having 1.6 μm of film thickness is formed in this embodiment. A contact hole reaching a source wiring 324 and a contact hole reaching each impurity region are formed following to the above. Plural etching processes are carried out in order in this embodiment. In this embodiment, the first layer insulating film is etched with an insulating film (not shown) used as an etching stopper after the second interlayer insulating film is etched with the first interlayer insulating film used as an etching stopper, and then, the insulating film (not shown) is etched.

A wiring and a pixel electrode are formed by means of Al, Ti, Mo and W after the above. It is desirable to use a material superior in reflectiveness such as a film based on Al or Ag and a film of piled layers thereof for a material of the above electrode and pixel electrode. Wirings 347 to 352 and a pixel electrode 353 are thus formed.

A drive circuit 405 including a P-channel type of TFT 401 and an N-channel type of TFT 402 and a pixel portion 406 including a pixel TFT 403 and a storage capacity 404 can be formed on a same substrate as described above (FIG. 6). Such substrate is referred to as an active matrix substrate for convenience in this specification.

The P-channel type of TFT 401 of the drive circuit 405 includes a channel forming region 354, a P type of impurity region in the second concentration 341 a part of which overlaps the first electrode 320a of a second shape gate electrode 320, and P types of impurity region in the first concentration 339 and 340 working as a source region or a source region. The N-channel type of TFT 402 includes a channel forming region 355, an N type of impurity region in the second concentration 335 a part of which overlaps the first electrode 321a of a second shape gate electrode 321, and an N type of impurity region in the third concentration 332 working as a source region or a source region. Such N-channel type of TFT and P-channel type of TFT can form a shift register circuit, a buffer circuit, level shifter circuit and a latch circuit. For the purpose of preventing deterioration caused by a hot carrier effect, a structure of the N-channel type of TFT 402 is suitable especially for a buffer circuit whose drive voltage is high.

The pixel TFT 403 (an N-channel type of TFT) of the pixel portion 406 includes a channel forming region 356, an N type of impurity region in the first concentration 327 formed outside the first electrode 322a of a gate electrode in the second shape 322, and an N type of impurity region in the third concentration 333 working as a source region or a source region. A P type impurity region in the first concentration 344 and P types of impurity regions having the second concentration 342 and 343 are formed on a semiconductor layer working as one electrode of the storage capacity 404. The storage capacity 404 comprises the second shape conductive layer 323 and the semiconductor layer 305, with an insulating film (a film same as a gate insulating film) used as dielectric.

In a pixel TFT of the pixel portion 406, reduction in OFF-state current and in dispersion is significantly achieved compared with the conventional TFT since a semiconductor layer is level by the third condition laser beam radiation.

Further, forming a pixel electrode by means of a transparent conductive film enables a transparent type of display device to be formed although one more photo-mask is required.

Figure 7:
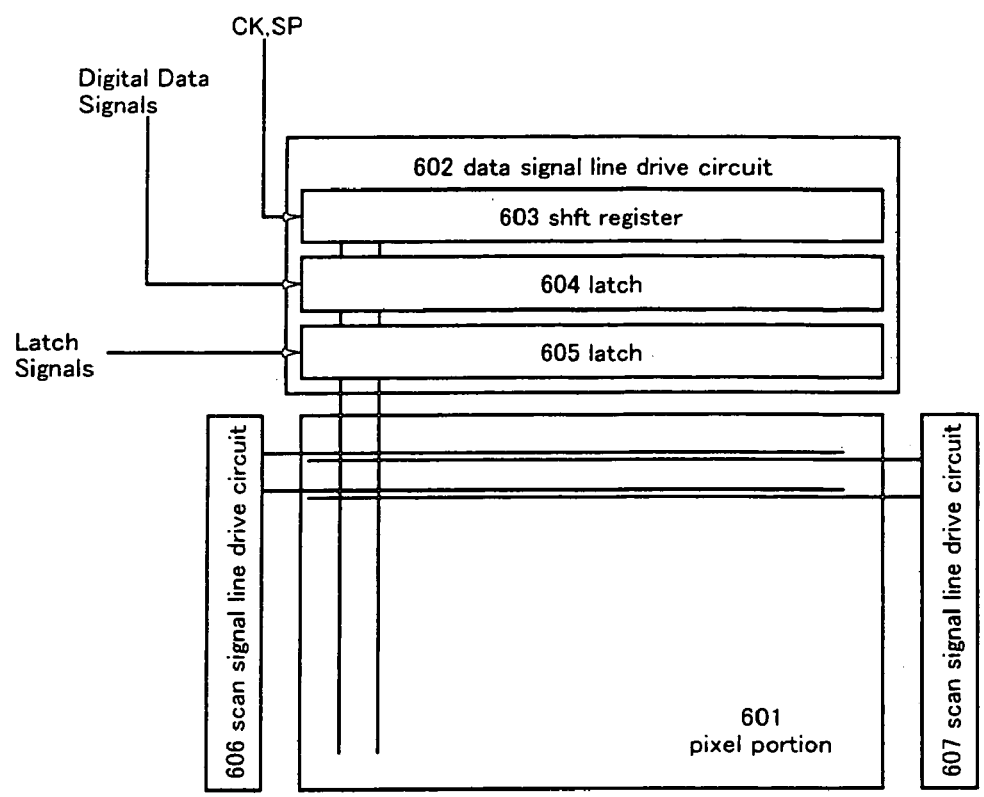
FIG. 7 illustrates an example of a circuit structure of an active matrix substrate.

FIG. 7 illustrates a circuit block showing an example of a circuit structure of an active matrix substrate. In FIG. 7, formed a pixel portion 601, a data signal line drive circuit 602, and a scan signal line drive circuit 606 in which a TFT is incorporated there.

The data signal line drive circuit 602 comprises a shift register 603, latches 604 and 605 and a buffer circuit. A clock signal and a start signal are inputted to the shift register 603, while a digital data signal and a latch signal are inputted to the latches. The scan signal line drive circuit 606 also comprises a shift register and a buffer circuit. The number of pixels of the pixel portion 601 is optional. In the case of XGA, 1024×768 pixels can be provided.

Such active matrix substrate enables a display device for active matrix driving to be formed. A pixel electrode is made of an optically reflective material in this embodiment. Thus, a reflective type of display device can be formed when the pixel electrode in this embodiment is applied to a liquid crystal display device. Using the substrate described above, a liquid crystal display device and a light emitting device in which an organic light emitting element forms a pixel portion can be formed. Accordingly, it is possible to manufacture an active matrix substrate corresponding to a reflective type of display device.

Embodiment 2

In this embodiment, the invention can also be applied to a step of manufacturing a bottom gate type of TFT. The step of manufacturing a bottom gate type of TFT will be briefly described with reference to FIGS. 8A through 9C.

Figure 8A:
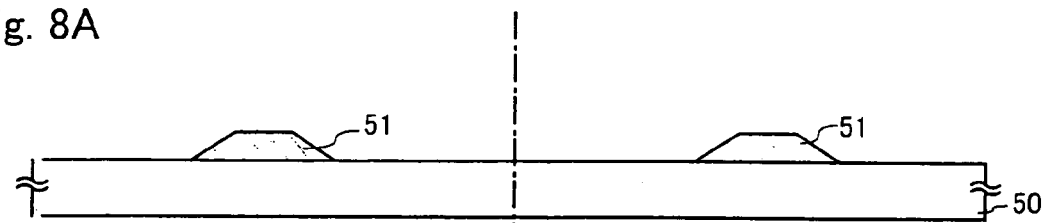
FIGS. 8A through 8E illustrate an embodiment of the invention.

An insulating film such as silicon oxide film, silicon nitride film and silicon oxide nitride film (not shown) is formed on a substrate 50, and then, a conductive film is formed and patterned into a desired shape so as to form a gate electrode 51. As a conductive film, an element selected from Ta, Ti, W, Mo, Cr and Al, or a conductive film based on any of the above elements may be used (FIG. 8a).

Figure 8B:
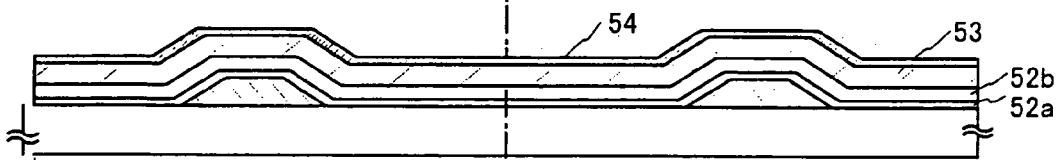

A gate insulating film 52 (52a, 52b) is then formed. The gate insulating film may be in a structure comprising a single layer or piled layers of a silicon oxide film, a silicon nitride film, or a silicon oxynitride film (FIG. 8b).

Next, an amorphous silicon film 53 is formed as an amorphous semiconductor film by a heat CVD method, a plasma CVD method, a pressure reduction CVD method, a vapor deposition method, or a sputtering method so as to be 10 to 150 nm in thickness. The gate insulating film 52 and the amorphous silicon film 53 may be continuously formed since it is possible to form the both by a same forming method. Continuous forming can prevent the both films from being exposed to the air, and thereby, the surfaces thereof can be prevented from being contaminated, which can reduce characteristic dispersion of a TFT to be manufactured as well as variation in a threshold voltage.

The amorphous silicon film 53 is then crystallized to form a crystal silicon film.

Any of a method using laser beam radiation, a method using heat and a method using a catalyst element described in the embodiment modes 2 and 3 can be selected for the crystallization.

Figure 8C:
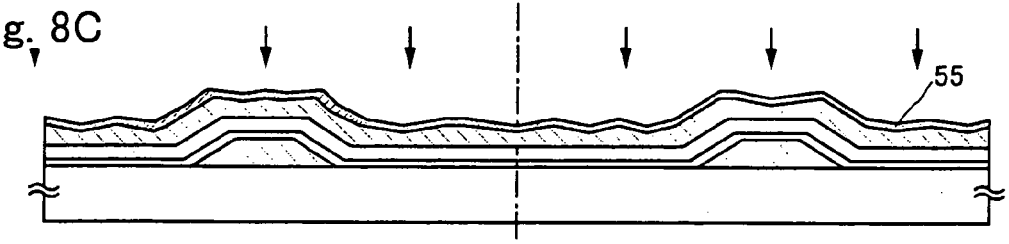

A crystallization method using the laser beam radiation will be described in this embodiment. First, an amorphous semiconductor film is washed by means of ozone water in a pretreatment of the laser beam radiation so that an oxide film 54 would be formed on the amorphous semiconductor film. Second, the amorphous semiconductor film is radiated with a laser beam in the first condition (an XeCl laser beam (308 nm of wavelength) at 400 mJ/cm$^2$ in energy density and 30 ns in pulse width in this embodiment) in a nitrogen atmosphere to form a crystallized semiconductor film. The surface of this crystallized semiconductor film formed by the first condition laser beam radiation has a convex portion in which a difference between the top and bottom points thereof is several nm to several tens nm (FIG. 8C).

Following to the above, radiation with the laser beam in the second condition (an ArF laser beam (193 nm of wavelength) at 300 mJ/cm$^2$ in energy density and 5 ns in pulse width in this embodiment) is carried out to perform abrasion of the oxide film on the crystallized semiconductor film. The oxide film on the crystallized semiconductor film is thereby eliminated.

Figure 8D:
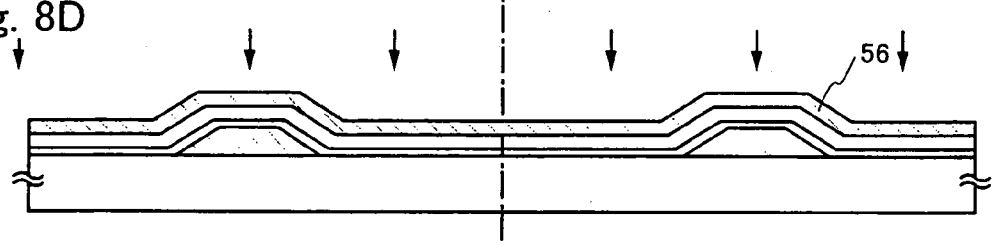
Figure 8E:
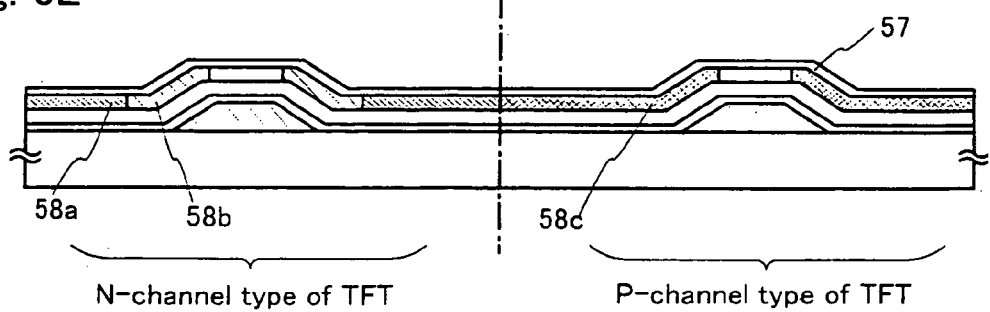
Figure 9A:
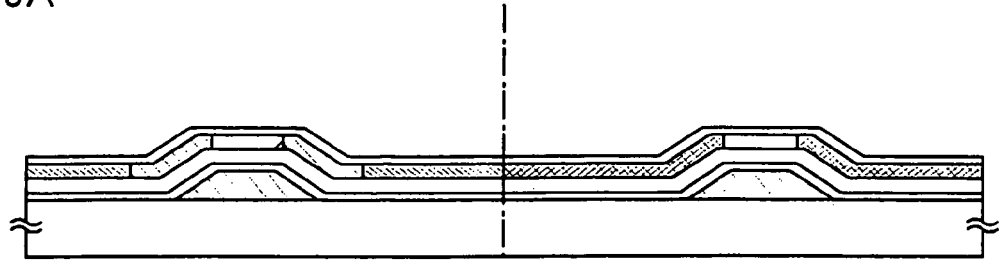
FIGS. 9A through 9C illustrate an embodiment of the invention.
Figure 9B:
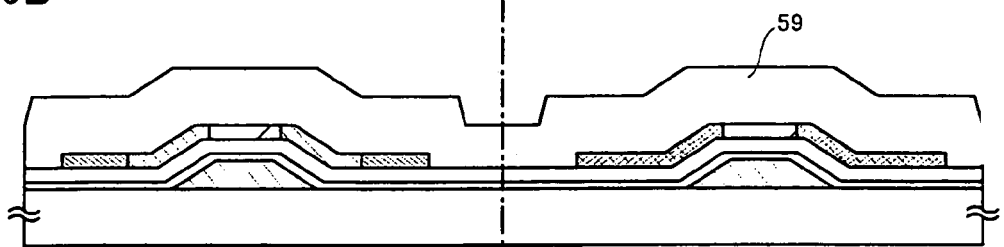
Figure 9C:
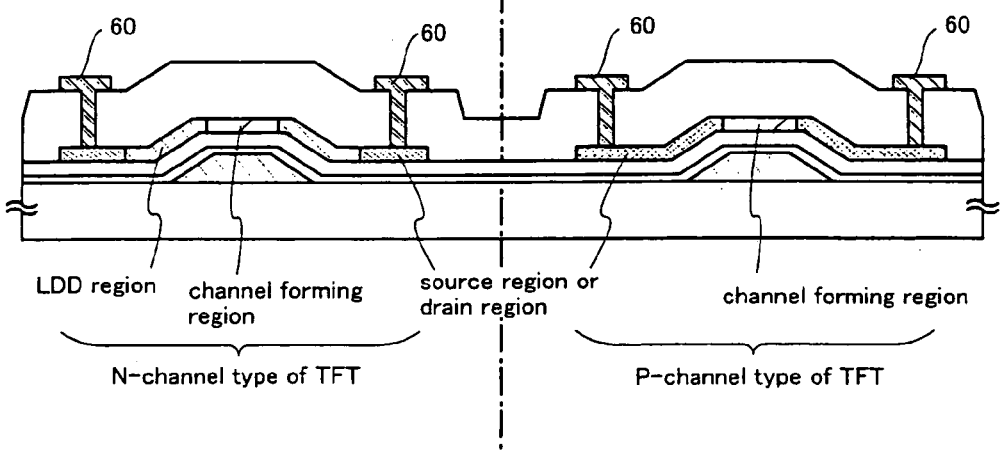

The laser beam in the third condition (an XeCl laser beam (308 nm of wavelength) at 430 mJ/cm$^2$ in energy density and 30 ns in pulse width in this embodiment) is then carried out to level the surface of the crystallized semiconductor film. A crystallized semiconductor film 56 so obtained and having the leveled surface is used for a semiconductor layer containing a channel forming region, a source region, and a source region (FIG. 8d).

Next, an insulating film 57 for protecting a crystal silicon film (a channel forming region) in a later-mentioned step of adding impurity is formed to be 100 to 400 nm in thickness. This insulating film is formed in order to prevent the crystal silicon film from being directly exposed to plasma in adding an impurity element and further in order to enable the concentration to be fine controlled.

A mask comprising a resist (not shown) is then used to add an impurity element giving the N type to a crystal silicon film, which is to be later an active layer of an N-channel type of TFT, and an impurity element giving the P type to a crystal silicon film, which is to be later an active layer of a P-channel type of TFT, so as to form a source region 58a, a source region and 58c, and an LDD region 58b.

A step of activating the impurity element added to the crystal silicon film is then carried out. Following to this, an insulating film 57 on the crystal silicon film is eliminated and the crystal silicon film is patterned into a desired shape before a interlayer insulating film 59 is formed. The interlayer insulating film is formed by means of an insulating film such as a silicon oxide film, a silicon nitride film and a silicon oxynitride film so as to be 500 to 1500 nm in thickness. Then, a contact hole reaching a source region or a source region of each TFT is formed so that a wiring 60 for electrically connecting respective TFTs would be formed.

The invention can be applied regardless of the shape of a TFT, as described above.

Embodiment 3

Figure 10:
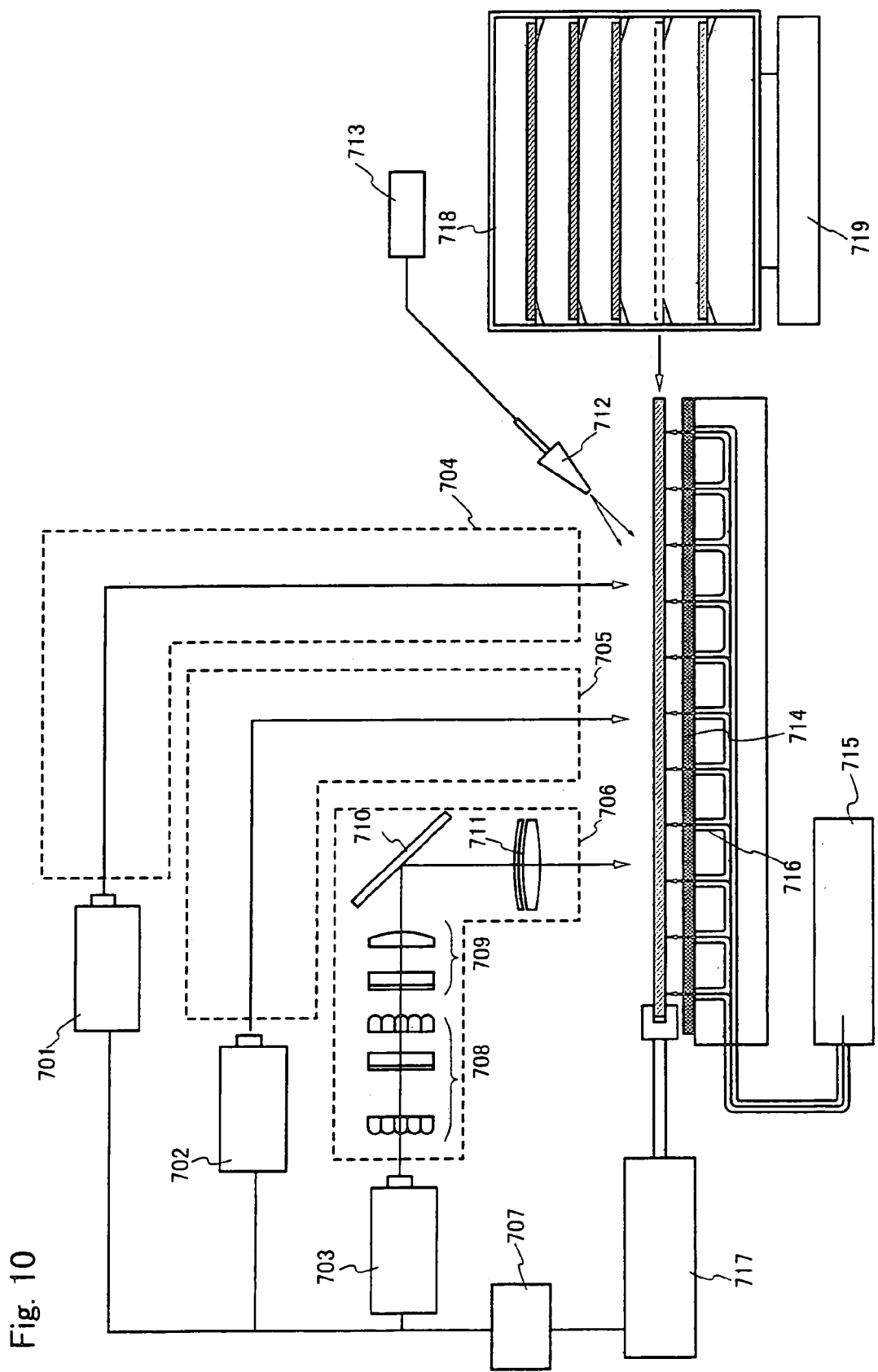
FIG. 10 illustrates an example of a laser beam radiation processing apparatus used in the invention.

In this embodiment, an example of an apparatus for carrying out a laser beam radiation process applicable to the invention will be described with reference to FIG. 10.

A laser beam radiation processing apparatus comprises a laser for radiation of a first condition laser beam 701, a laser for radiation of a second condition laser beam 702, a laser for radiation of a third condition laser beam 703, optical systems 704, 705 and 706 for oscillating laser beams in the respective conditions, and a controller device 707.

A gas laser such as an excimer laser oscillating a light having 400 nm or less of wavelength, and a solid state laser such as an Nd:YAG laser and a YLF laser can be used as the laser beam in the first condition.

A laser having a shorter wavelength, lower energy density and smaller pulse width than the laser beam in the first condition, such as a laser oscillating a beam having a wavelength in an ultraviolet area or a vacuum ultraviolet area, is used for the laser beam in the second condition. An excimer laser having a short wavelength such as an ArF laser and a KrF laser may be used, for example. A fourth higher harmonic beam of a YAG laser may also be used.

A gas laser such as an excimer laser oscillating a light having 400 nm or less of wavelength, and a solid state laser such as an Nd:YAG laser and a YLF laser can be used as the laser beam in the third condition. The energy density is set to be 30 to 60 mJ/cm$^2$ larger then that of the first condition.

The laser beams in the first and third condition can have a same wavelength. Thus, the laser beams in the first and third conditions may be laser beams having energy density in the first and third conditions, the beams being separated through an optical system after emitted from a same laser source.

In the case that a laser beam having a same wavelength is used for laser beams in the first and third conditions, it is possible to first carry out the first and second condition laser beam radiation to provide an optical system capable of emitting a laser beam in the third condition to an optical system for emitting a laser beam in the first condition, and then, carry out the third condition laser beam radiation. A person who carries out the invention can properly determine any condition for the third condition laser beam radiation other than the order of the radiation.

Optical systems 704 to 706 are provided for focusing and extending a laser beam emitted from a laser so that a surface to be radiated would be radiated with a laser beam having a thin and linear cross-section. FIG. 10 illustrates an example of an optical system comprising a cylindrical lens array 708, a cylindrical lens 709, a mirror 710 and a tablet cylindrical lens 711. It is possible to carry out radiation with a linear laser beam, which is around 100 to 400 mm in a longitudinal direction and around 100 to 500 μm in a latitudinal direction although this size of the laser beam depends on the size of lenses. A person who carries out the invention can use any optical system.

There are other devices provided to the above laser beam radiation processing apparatus, such as a nozzle for jetting gas for eliminating dust on a device substrate 712, a means for supplying the above gas 713, a stage 714, a cassette for storing substrates 718, a means for holding the cassette 719 and a means for transportation (scanning) 717 for the purpose of holding processed substrates and carrying out the radiation in the three laser beam conditions.

The nozzle for jetting gas for eliminating dust on a device substrate 712 is also used for the purpose of eliminating a film spattered in abrasion of an oxide film carried out by means of the second condition laser beam radiation.

The stage 714 is connected with gas supplying means for supplying compressed nitrogen for supplying an atmosphere 715 and 716, so that the gas would be jetted from a small hole provided on a surface of the stage 714 to enable a processed substrate to be held in a floating condition without contacting to the stage. Such jet of the gas from the small hole enables an easily bending substrate to be held evenly.

Moreover, holding a substrate in a floating condition can prevent the substrate from being contaminated, so that a change in temperature of the substrate can be made small, which results in high effectiveness.

A substrate can be taken out from the holding cassette 718 in order to carry out a laser beam radiation process by means of a transportation means 717 provided with an arm. The laser beam radiation process can be performed all over the process substrate by holding an end portion of the substrate by the arm and scanning the substrate in one direction. A controller device 707 controls an engaging operation of oscillation of a laser beam and the transportation means.

In the laser beam radiation in three conditions, one substrate may be scanned either once or plural times.

In the case of processing a large substrate having a side longer than the longitudinal length of a liner laser beam (for example, a substrate in which one side is more than 1000 mm in length and 1 mm or less in thickness), a processing apparatus should be provided with a transportation means, which can transport the substrate in a direction rectangular to one axis direction. In an apparatus including two transportation means capable of scanning a process substrate in a direction rectangular each other, the laser beam radiation process can be performed all over the surface of a glass substrate, even when the glass substrate is 1200 mm×1600 mm or 2000 mm×2500 mm in length and 0.4 to 0.7 mm in thickness, for example.

The larger the area and the thinner the thickness of a glass substrate is, the easier the substrate bends. However, in a stage for holding a substrate by means of gas as shown in a processing apparatus used in this embodiment, the laser beam radiation process can be performed while an level surface can be kept.

An apparatus shown in this embodiment can be used in embodiment modes 1 to 3 and the embodiments 1 and 2.

Embodiment 4

The CMOS circuit and the pixel portion formed by implementing the present invention can be used in active matrix type liquid crystal display device (liquid crystal display device). That is, the present invention can be applied to all of electronic apparatuses integrated with such liquid crystal display device at display portions thereof. By using the liquid crystal display device formed by using the present invention, high definition display can be realized, and further, the driver circuit can be formed on the same substrate as the pixel portion. Thus, the bigger display portion can be formed.

As such electronic apparatus, there are pointed out a video camera, a digital camera, a projector (rear type or front type), a head mount display (goggle type display), a personal computer, a portable information terminal (mobile computer, mobile telephone or electronic book) and the like. Examples of these are shown in FIG. 11A through 11F, FIGS. 12A through 12D and FIGS. 13A through 13C.

Figure 11A:
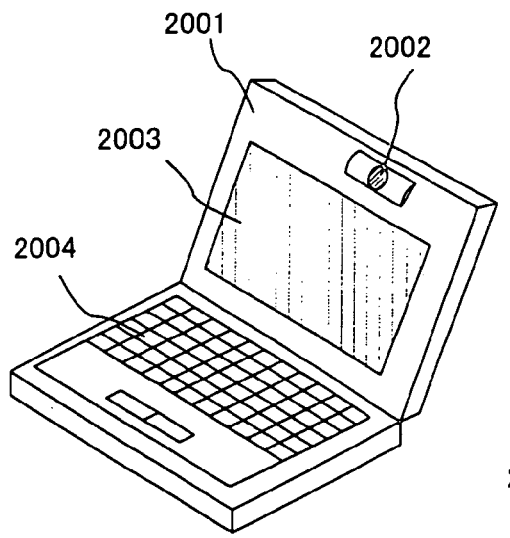
FIGS. 11A through 11F illustrate an example of an electronic apparatus.

FIG. 11A shows a personal computer including a main body 2001, an image input portion 2002, a display portion 2003 and a keyboard 2004. The liquid crystal display device formed by using the present invention can be adapted to the display portion 2003.

Figure 11B:
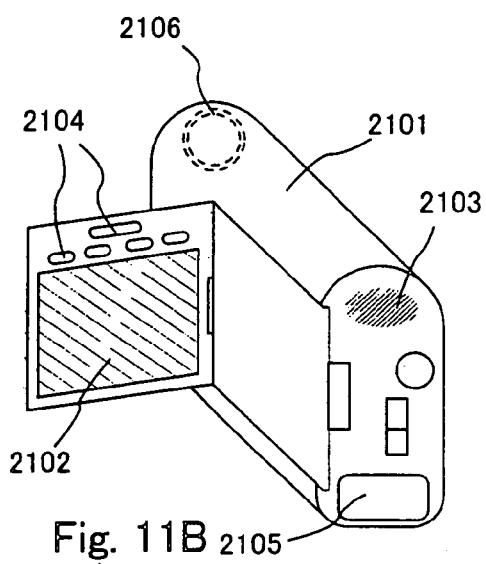

FIG. 11B shows a video camera including a main body 2101, a display portion 2102, a voice input portion 2103, operation switches 2104, a battery 2105 and an image receiving portion 2106. The liquid crystal display device formed by using the present invention can be adapted to the display portion 2102.

Figure 11C:
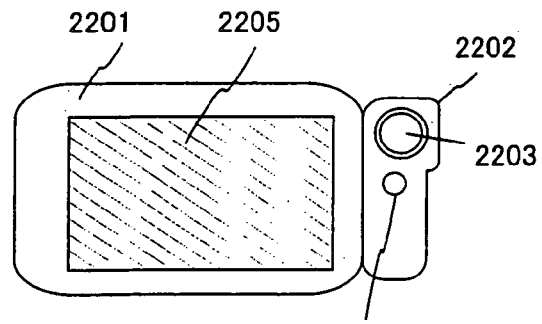

FIG. 11C shows a mobile computer including a main body 2201, a camera portion 2202, an image receiving portion 2203, an operation switch 2204 and a display portion 2205. The liquid crystal display device formed by using the present invention can be adapted to the display portion 2205.

Figure 11D:
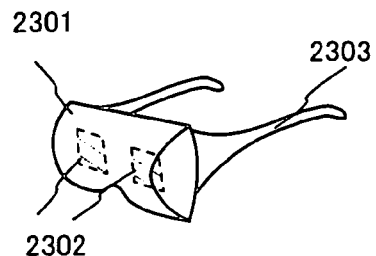

FIG. 11D shows a goggle type display including a main body 2301, a display portion 2302 and an arm portion 2303. The liquid crystal display device formed by using the present invention can be adapted to the display portion 2302.

Figure 11E:
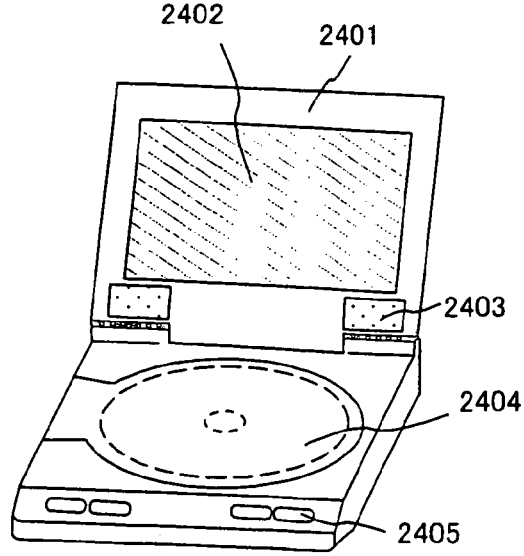

FIG. 11E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet. The liquid crystal display device formed by using the present invention can be adapted to the display portion 2402.

Figure 11F:
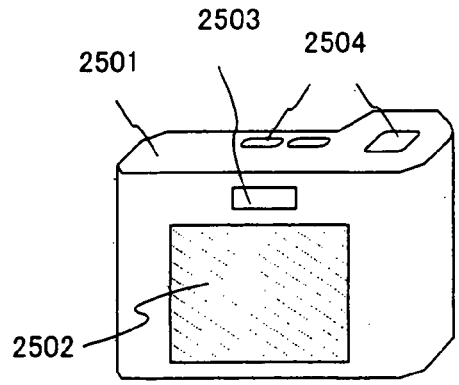

FIG. 11F shows a digital camera including a main body 2501, a display portion 2502, an eye contact portion 2503, operation switches 2504 and an image receiving portion (not illustrated). The liquid crystal display device formed by using the present invention can be adapted to the display portion 2502.

Figure 12A:
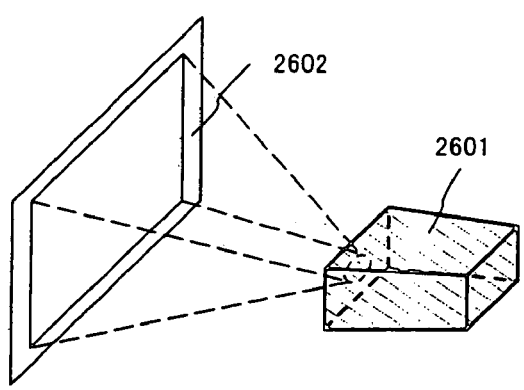
FIGS. 12A through 12D illustrate an example of an electronic apparatus.

FIG. 12A shows a front type projector including a projection apparatus 2601 and a screen 2602.

Figure 12B:
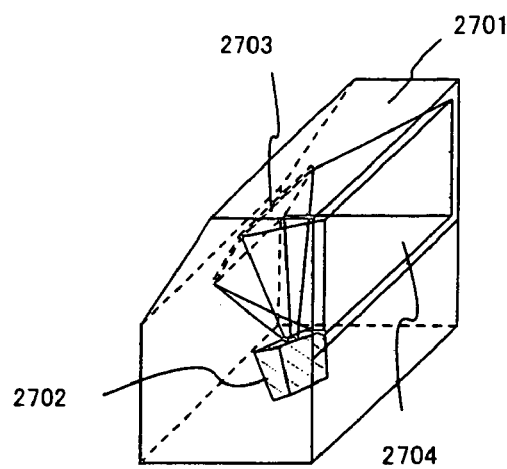

FIG. 12B shows a rear type projector including a main body 2701, a projection apparatus 2702, a mirror 2703 and a screen 2704.

Figure 12C:
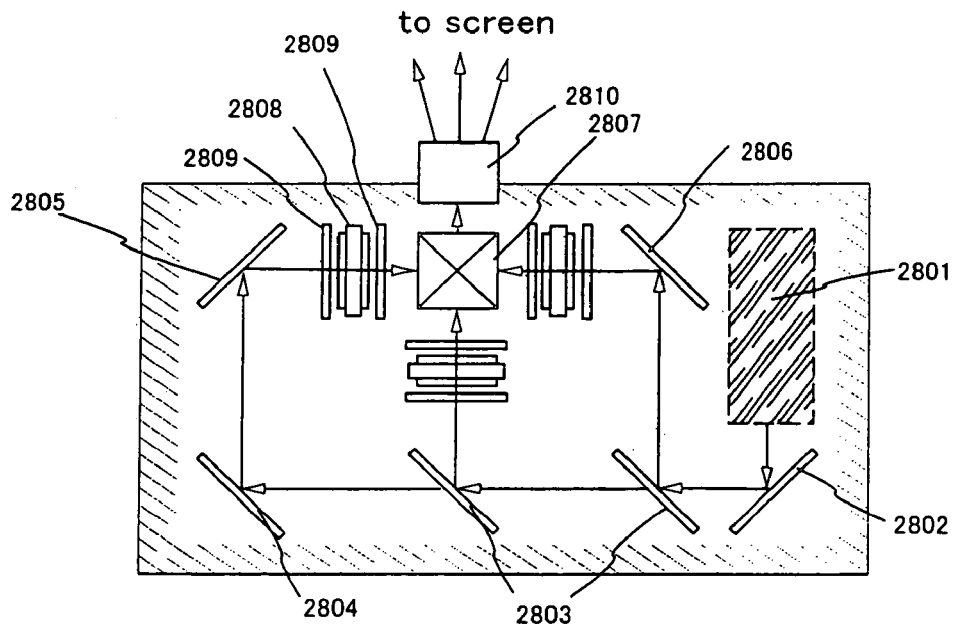

Further, FIG. 12C is a view showing an example of a structure of the projection apparatus 2601 and 2702 in FIG. 12A and FIG. 12B, respectively. The projection apparatus 2601 or 2702 is constituted by a light source optical system 2801, mirrors 2802, and 2804 through 2806, a dichroic mirror 2803, a prism 2807, a liquid crystal display apparatus 2808, a phase difference plate 2809 and a projection optical system 2810.

The projection optical system 2810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 12C.

Figure 12D:
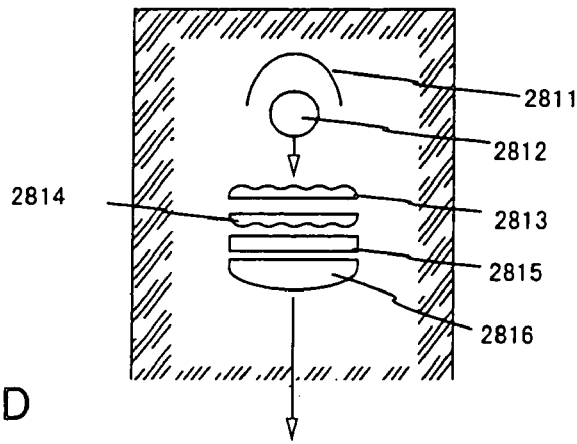

Further, FIG. 12D is a view showing an example of a structure of the light source optical system 2801 in FIG. 12C. According to this embodiment, the light source optical system 2801 is constituted by a reflector 2811, a light source 2812, lens arrays 2813 and 2814, a polarization conversion element 2815 and a focusing lens 2816.

Further, the light source optical system shown in FIG. 12D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 12A, 12B and 12C, there is shown a case of using a transmission type electro-optical apparatus and an example of applying a reflection type electro-optical apparatus is not illustrated.

Figure 13A:
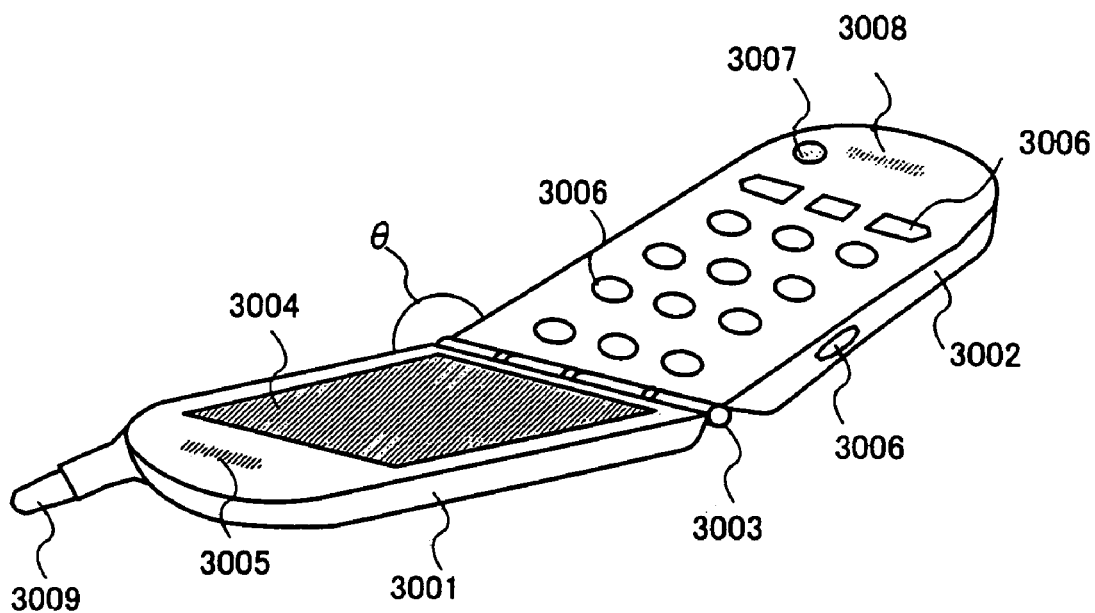
FIGS. 13A through 13C illustrate an example of an electronic apparatus.

FIG. 13A shows a mobile telephone including a display panel 3001, an operation panel 3002. The display panel 3001 and the operation panel 3002 are connected to each other in the connecting portion 3003. In the connecting portion 3003, the angle θ between a face, which is provided the display portion 3004 of the display panel 3001, and a face, which is provided the operation key 3006 of the operation panel 3002, can be changed arbitrary. Further, a voice output portion 3005, an operation key 3006, a power source switch 3007 and a sound input portion 3008 are also included. The liquid crystal display device formed by using the present invention can be adapted to the display portion 3004.

Figure 13B:
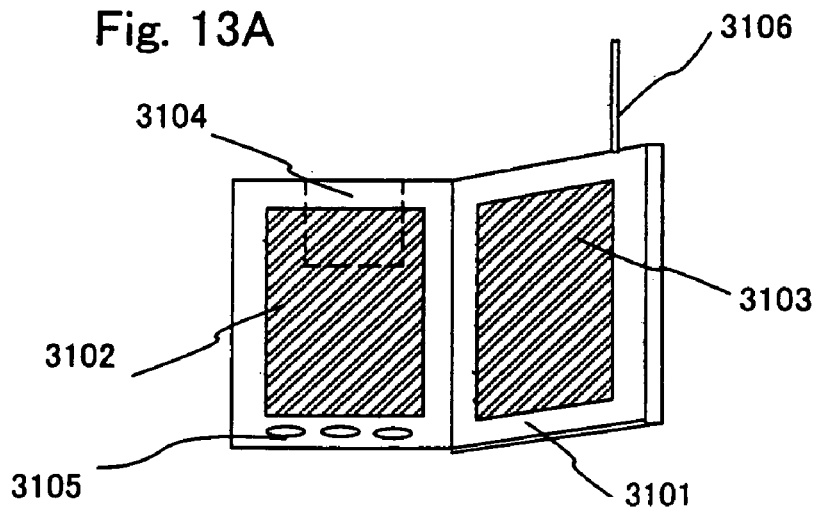

FIG. 13B shows a portable book (electronic book) including a main body 3101, display portions 3102 and 3103, a record medium 3104, an operation switch 3105 and an antenna 3106. The liquid crystal display device formed by using the present invention can be adapted to the display portion 3102.

Figure 13C:
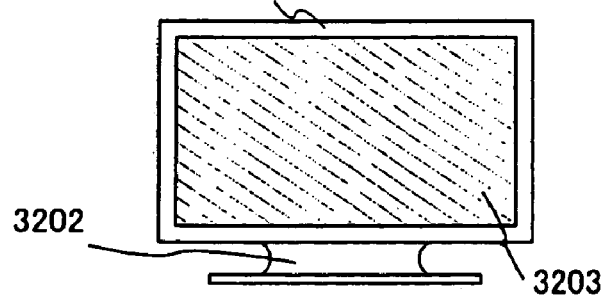

FIG. 13C shows a display including a main body 3201, a support base 3202 and a display portion 3203. The display according to the invention is advantageous particularly in the case of large screen formation and is advantageous in the display having a diagonal length of 10 inches or more (particularly, 30 inches or more). The liquid crystal display device formed by using the present invention can be adapted to the display portion 3203.

As has been described, the range of applying the invention is extremely wide and is applicable to electronic apparatus of all the fields. Further, the electronic apparatus of this embodiment can be realized by using any constitution comprising any combinations of Embodiment modes 1 to 3 and Embodiments 1 to 3.

As described above, leveling a semiconductor layer in accordance with the invention can solve the problem relating to dispersion of an element characteristic caused by surface roughness of a semiconductor film (such as a problem that leakage easily occurs in an OFF operation of a TFT due to partially large film thickness of a semiconductor layer, and a problem that electrostatic focusing occurs to raise an OFF current).

Furthermore, carriers to be trapped decrease as well as variation in threshold voltage can be held down due to a good interface between a semiconductor layer and a gate insulating film, so that reliability can be improved.

Using a semiconductor film formed by applying the invention to manufacture a TFT enables the TFT to have a low OFF current and high reliability.

What is claimed is:

1. A method for manufacturing a semiconductor device comprising:

forming a semiconductor film over an insulating surface;

forming an oxide film on the semiconductor film;

radiating the semiconductor film with a first laser beam using a lens;

radiating the semiconductor film with a second laser beam after radiating with the first laser beam; and radiating the semiconductor film with a third laser beam after radiating with the second laser beam, wherein a wavelength of the second laser beam and a wavelength of the third laser beam are different from a wavelength of the first laser beam.

2. The method for manufacturing the semiconductor device according to claim 1, wherein a crystallized semiconductor film is formed after radiating the semiconductor film with the first laser beam.

3. The method for manufacturing the semiconductor device according to claim 1, wherein the oxide film on the semiconductor film is removed after radiating the semiconductor film with the second laser beam.

4. The method for manufacturing the semiconductor device according to claim 1, wherein a surface of the semiconductor film is level after radiating the semiconductor film with the second laser beam.

5. The method for manufacturing the semiconductor device according to claim 1, wherein an energy density of the first laser beam is 300 to 500 mJ/cm$^2$.

6. A method for manufacturing a semiconductor device comprising:
   forming a semiconductor film over an insulating surface;
   forming an oxide film on the semiconductor film;
   radiating the semiconductor film with a first laser beam;
   radiating the semiconductor film with a second laser beam after radiating with the first laser beam under an atmosphere comprising at least one of hydrogen and an inert gas; and
   radiating the semiconductor film with a third laser beam after radiating with the second laser beam;
   wherein a wavelength of the second laser beam and a wavelength of the third laser beam are different from a wavelength of the first laser beam.

7. The method for manufacturing the semiconductor device according to claim 6, wherein a crystallized semiconductor film is formed after radiating the semiconductor film with the first laser beam.

8. The method for manufacturing the semiconductor device according to claim 6, wherein the oxide film on the semiconductor film is removed after radiating the semiconductor film with the second laser beam.

9. The method for manufacturing the semiconductor device according to claim 6, wherein a surface of the semiconductor film is level after radiating the semiconductor film with the second laser beam.

10. The method for manufacturing the semiconductor device according to claim 6, wherein an energy density of the first laser beam is 300 to 500 mJ/cm$^2$.

11. A method for manufacturing a semiconductor device comprising:
   forming a semiconductor film over an insulating surface;
   forming an oxide film on the semiconductor film;
   radiating the semiconductor film with a first laser beam;
   radiating the semiconductor film with a second laser beam after radiating with the first laser beam; and
   radiating the semiconductor film with a third laser beam after radiating with the second laser beam under an atmosphere comprising at least one of hydrogen and an inert gas,
   wherein a wavelength of the second laser beam and a wavelength of the third laser beam are different from a wavelength of the first laser beam.

12. The method for manufacturing the semiconductor device according to claim 11, wherein a crystallized semiconductor film is formed after radiating the semiconductor film with the first laser beam.

13. The method for manufacturing the semiconductor device according to claim 11, wherein the oxide film on the semiconductor film is removed after radiating the semiconductor film with the second laser beam.

14. The method for manufacturing the semiconductor device according to claim 11, wherein a surface of the semiconductor film is level after radiating the semiconductor film with the second laser beam.

15. The method for manufacturing the semiconductor device according to claim 11, wherein an energy density of the first laser beam is 300 to 500 mJ/cm$^2$.

16. A method for manufacturing a semiconductor device comprising:
   forming a semiconductor film over an insulating surface;
   forming an oxide film on the semiconductor film;
   radiating the semiconductor film with a first laser beam;
   radiating the semiconductor film with a second laser beam after radiating with the first laser beam; and
   radiating the semiconductor film with a third laser beam after radiating with the second laser beam,
   wherein a pulse width of the second laser beam is smaller than a pulse width of the first laser beam, and
   wherein a wavelength of the second laser beam and a wavelength of the third laser beam are different from a wavelength of the first laser beam.

17. The method for manufacturing the semiconductor device according to claim 16, wherein a crystallized semiconductor film is formed after radiating the semiconductor film with the first laser beam.

18. The method for manufacturing the semiconductor device according to claim 16, wherein the oxide film on the semiconductor film is removed after radiating the semiconductor film with the second laser beam.

19. The method for manufacturing the semiconductor device according to claim 16, wherein a surface of the semiconductor film is level after radiating the semiconductor film with the second laser beam.

20. The method for manufacturing the semiconductor device according to claim 16, wherein an energy density of the first laser beam is 300 to 500 mJ/cm$^2$.

21. A method for manufacturing a semiconductor device comprising:
   forming a semiconductor film over an insulating surface;
   forming an oxide film on the semiconductor film;
   radiating the semiconductor film with a first laser beam;
   radiating the semiconductor film with a second laser beam after radiating with the first laser beam; and
   radiating the semiconductor film with a third laser beam after radiating with the second laser beam,
   wherein an energy of the third laser beam is higher than an energy of the first laser beam, and
   wherein a wavelength of the second laser beam and a wavelength of the third laser beam are different from a wavelength of the first laser beam.

22. The method for manufacturing the semiconductor device according to claim 21, wherein a crystallized semiconductor film is formed after radiating the semiconductor film with the first laser beam.

23. The method for manufacturing the semiconductor device according to claim 21, wherein the oxide film on the semiconductor film is removed after radiating the semiconductor film with the second laser beam.

24. The method for manufacturing the semiconductor device according to claim 21, wherein a surface of the semiconductor film is level after radiating the semiconductor film with the second laser beam.

25. The method for manufacturing the semiconductor device according to claim 21, wherein an energy density of the first laser beam is 300 to 500 mJ/cm$^2$.

26. A method for manufacturing a semiconductor device comprising:
- forming a semiconductor film over an insulating surface;
- forming an oxide film on the semiconductor film;
- crystallizing the semiconductor film by a heat treatment to form a crystallized semiconductor film;
- radiating the crystallized semiconductor film with a first laser beam;
- radiating the crystallized semiconductor film with a second laser beam after radiating with the first laser beam; and
- radiating the crystallized semiconductor film with a third laser beam after radiating with the second laser beam,
- wherein a wavelength of the second laser beam and a wavelength of the third laser beam are different from a wavelength of the first laser beam.

27. The method for manufacturing the semiconductor device according to claim 26, wherein a crystallized semiconductor film having improved crystal characteristics is formed after radiating the semiconductor film with the first laser beam.

28. The method for manufacturing the semiconductor device according to claim 26, wherein the oxide film on the crystallized semiconductor film is removed after radiating the crystallized semiconductor film with the second laser beam.

29. The method for manufacturing the semiconductor device according to claim 26, wherein a surface of the crystallized semiconductor film is level after radiating the crystallized semiconductor film with the second laser beam.

30. The method for manufacturing the semiconductor device according to claim 26, wherein an energy density of the first laser beam is 300 to 500 mJ/cm$^2$.

31. The method for manufacturing the semiconductor device according to claim 1, wherein the first laser beam is one selected from the group consisting of an excimer laser, Nd:YAG laser, and a YLF laser.

32. The method for manufacturing the semiconductor device according to claim 1, wherein the second laser beam is one selected from the group consisting of an excimer laser, ArF laser, and a KrF laser.

33. The method for manufacturing the semiconductor device according to claim 1, wherein the third laser beam is one selected from the group consisting of an excimer laser, Nd:YAG laser, and a YLF laser.

34. The method for manufacturing the semiconductor device according to claim 6, wherein the first laser beam is one selected from the group consisting of an excimer laser, Nd:YAG laser, and a YLF laser.

35. The method for manufacturing the semiconductor device according to claim 6, wherein the second laser beam is one selected from the group consisting of an excimer laser, ArF laser, and a KrF laser.

36. The method for manufacturing the semiconductor device according to claim 6, wherein the third laser beam is one selected from the group consisting of an excimer laser, Nd:YAG laser, and a YLF laser.

37. The method for manufacturing the semiconductor device according to claim 11, wherein the first laser beam is one selected from the group consisting of an excimer laser, Nd:YAG laser, and a YLF laser.

38. The method for manufacturing the semiconductor device according to claim 11, wherein the second laser beam is one selected from the group consisting of an excimer laser, ArF laser, and a KrF laser.

39. The method for manufacturing the semiconductor device according to claim 11, wherein the third laser beam is one selected from the group consisting of an excimer laser, Nd:YAG laser, and a YLF laser.

40. The method for manufacturing the semiconductor device according to claim 16, wherein the first laser beam is one selected from the group consisting of an excimer laser, Nd:YAG laser, and a YLF laser.

41. The method for manufacturing the semiconductor device according to claim 16, wherein the second laser beam is one selected from the group consisting of an excimer laser, ArF laser, and a KrF laser.

42. The method for manufacturing the semiconductor device according to claim 16, wherein the third laser beam is one selected from the group consisting of an excimer laser, Nd:YAG laser, and a YLF laser.

43. The method for manufacturing the semiconductor device according to claim 21, wherein the first laser beam is one selected from the group consisting of an excimer laser, Nd:YAG laser, and a YLF laser.

44. The method for manufacturing the semiconductor device according to claim 21, wherein the second laser beam is one selected from the group consisting of an excimer laser, ArF laser, and a KrF laser.

45. The method for manufacturing the semiconductor device according to claim 21, wherein the third laser beam is one selected from the group consisting of an excimer laser, Nd:YAG laser, and a YLF laser.

46. The method for manufacturing the semiconductor device according to claim 26, wherein the first laser beam is one selected from the group consisting of an excimer laser, Nd:YAG laser, and a YLF laser.

47. The method for manufacturing the semiconductor device according to claim 26, wherein the second laser beam is one selected from the group consisting of an excimer laser, ArF laser, and a KrF laser.

48. The method for manufacturing the semiconductor device according to claim 26, wherein the third laser beam is one selected from the group consisting of an excimer laser, Nd:YAG laser, and a YLF laser.

49. The method for manufacturing the semiconductor device according to claim 6, wherein the inert gas is selected from the group consisting of nitrogen, argon, helium, neon, krypton and xenon.

50. The method for manufacturing the semiconductor device according to claim 11, wherein the inert gas is selected from the group consisting of nitrogen, argon, helium, neon, krypton and xenon.

* * * * *